US007113758B2

(12) United States Patent
Kishi

(10) Patent No.: US 7,113,758 B2
(45) Date of Patent: Sep. 26, 2006

(54) AUTOMATIC GAIN CONTROLLER

(75) Inventor: Takahiko Kishi, Yokohama (JP)

(73) Assignee: Samsung Electronics Co., Ltd., (KR)

( * ) Notice: Subject to any disclaimer, the term of this patent is extended or adjusted under 35 U.S.C. 154(b) by 362 days.

(21) Appl. No.: 10/795,888

(22) Filed: Mar. 8, 2004

(65) Prior Publication Data
US 2004/0185810 A1 Sep. 23, 2004

(30) Foreign Application Priority Data
Mar. 6, 2003 (JP) .............................. 2003-059764

(51) Int. Cl.
H04B 1/06 (2006.01)
H04B 7/00 (2006.01)
(52) U.S. Cl. ............................... 455/234.1; 455/253.2; 375/345; 330/278; 330/295
(58) Field of Classification Search ............. 455/231.1, 455/234.1, 234.2, 235.1, 240.1, 249.1, 250.1, 455/253.2; 375/345; 330/278, 289
See application file for complete search history.

(56) References Cited
U.S. PATENT DOCUMENTS

| 5,625,321 | A | * | 4/1997 | Sasaki et al. ............ 330/124 R |
| 5,917,372 | A | * | 6/1999 | Kakura et al. ............... 330/129 |
| 6,088,583 | A | * | 7/2000 | Shimizu et al. ............ 455/235.1 |
| 6,242,982 | B1 | * | 6/2001 | Ibelings et al. ............ 455/234.1 |
| 6,728,524 | B1 | * | 4/2004 | Yamanaka et al. ......... 455/232.1 |
| 6,804,501 | B1 | * | 10/2004 | Bradley et al. ............. 455/245.2 |

FOREIGN PATENT DOCUMENTS
JP 3086060 7/2000
JP 3240458 10/2001

* cited by examiner

Primary Examiner—Quochien B. Vuong
(74) Attorney, Agent, or Firm—Dilworth & Barrese LLP

(57) ABSTRACT

Disclosed is an automatic gain controller capable of reducing signal saturation or signal distortion caused by out-of-band signals of a filter extracting an object signal or delay of a control signal and capable of precisely measuring a signal level in a filter band. An AGC response control section compares a level of control voltage ("V2_I terminal" signal) outputted from a first AGC control section and inputted into a "V2_I terminal" with a level of control voltage ("V3_I terminal" signal) outputted from a second AGC control section and inputted into a "V3_I terminal". If the control voltage, which is the "V3_I terminal" signal, outputted from the second AGC control section is less than the control voltage, which is a "V2_I terminal" signal, outputted from the first AGC control section, the AGC response control section controls an AGC amplifier by using the control voltage outputted from the second AGC control section. If the control voltage, which is the "V3_I terminal" signal, outputted from the second AGC control section is greater than the control voltage, which is the "V2_I terminal" signal, outputted from the first AGC control section, the AGC response control section controls the AGC amplifier by using the control voltage outputted from the first AGC control section.

14 Claims, 15 Drawing Sheets

AUTOMATIC GAIN CONTROLLER

PRIORITY

This application claims priority to an application entitled "Automatic Gain Controller" filed in the Japanese Intellectual Property Office on Mar. 6, 2003 and assigned Ser. No. 59764/2003, the contents of which are hereby incorporated by reference.

BACKGROUND OF THE INVENTION

1. Field of the Invention

The present invention relates to an automatic gain controller.

2. Description of the Related Art

In a conventional automatic gain controller having a filter in a control loop, an output signal of the conventional automatic gain controller is often interrupted due to a delay of response characteristics thereof caused by a signal delay from the filter. In order to solve the above problem, a method has been proposed, wherein if a signal level has a sudden variation, a control signal generator having a rapid time constant is utilized to create a control signal to cope with a delay of the control signal caused by the filter, and at the same time, control information is copied between the control signal generators in such a manner that an output signal of an automatic gain controller has no variation in level (referred to in Japanese Patent No. 3,240,458).

In addition, in the conventional automatic gain controller having the filter in the control loop, if a level control of an automatic gain control is carried out according to in-band signals of the filter, the automatic gain control may be carried out to match levels of the in-band signals of the filter. Accordingly, if out-of-band signals of the filter are greater than in-band signals of the filter, saturation caused by the out-of-band signals of the filter may occur in an amplifier installed at a front end of the filter. For this reason, a method has been proposed in which amplifiers are cascade-connected through a filter and an automatic gain control is separately carried out with respect to each amplifier installed at front and rear portions of the filter (referred to in Japanese Patent No. 3,086,060).

Although above-described Japanese Patent Publication No. 3,240,458 discloses a technique capable of solving a delay of response characteristics caused by a signal delay from a filter and properly generating an output signal of an automatic gain controller, when a level control of an automatic gain control is carried out according to in-band signals of the filter, saturation may occur in an amplifier installed at a front end of the filter caused by out-of-band signals of the filter, if out-of-band signals of the filter are greater than in-band signals of the filter.

In addition, although above-described Japanese Patent Publication No. 3,086,060 can adjust a signal level at a front end of a filter by tracking variations of levels of out-of-band signals of the filter, if an automatic gain control for the amplifier installed at the front end of the filter is carried out with a high-speed response according to variation of out-of-band signals of the filter, unnecessary variation may occur in the in-band object signals of the filter even though the object signals are not subject to variation.

That is, if the automatic gain control for the amplifier installed at the front end of the filter is carried out with the high-speed response according to the variations of the signals, the in-band object signals of the filter may be subject to unnecessary variation, so the automatic gain control for the amplifier installed at the rear end of the filter may be carried out according to the variations of the object signals with a high-speed response characteristic. However, if the automatic gain control with respect to the object signals is carried out with the high-speed response, signals may be modulated due to the automatic gain control and signal distortion may occur caused by an amplitude compression action of the automatic gain control.

Therefore, according to above-described Japanese Patent publication No. 3,086,060, the automatic gain control for the amplifier installed at the front end of the filter must be carried out with a low-speed response according to the variations of out-of-band signals of the filter. In such a case, noise is generated by the out-of-band signals of the filter due to low response characteristics of the automatic gain control. If the automatic gain control is carried out at a high-speed with respect to both amplifiers installed at front and rear ends of the filter, distortion of the object signals may occur when the automatic gain control is carried out with respect to the amplifier installed at the rear end of the filter, so communication quality will be lowered.

SUMMARY OF THE INVENTION

Accordingly, the present invention has been made to solve the above-mentioned problems occurring in the prior art, and an object of the present invention is to provide an automatic gain controller capable of reducing signal saturation or signal distortion caused by an out-of-band signal of a filter or a delay of a control signal, and precisely measuring a level of an in-band signal of the filter.

In order to accomplish the above object, according to a first aspect of the present invention, there is provided an automatic gain controller comprising: a first variable gain amplifying means, such as an AGC amplifier, for amplifying an input signal; a filter, such as an I-side channel filter or a Q-side channel filter, for limiting a band of an output signal of the first variable gain amplifying means; a second variable gain amplifying means, such as an I-side amplifier or a Q-side amplifier, for outputting an output signal of the filter by amplifying the output signal of the filter; a first control signal generating means, such as a first AGC control section, generating a first control signal for controlling a level of the output signal of the first variable gain amplifying means to a predetermined level; a second control signal generating means, such as a second AGC control section, generating a second control signal for controlling a level of an output signal of the second variable gain amplifying means to a predetermined level and outputting the second control signal to the second variable gain amplifying means; and a control signal selecting means, such as an AGC response control section, selecting one of the first and second control signals generated from the first and second control signal generating means and outputting a selected control signal to the first variable gain amplifying means.

According to the automatic gain controller having the above structure, the control signal selecting means selects one of the first and second control signals generated from the first and second control signal generating means in order to control the first variable gain amplifying means. Thus, the first variable gain amplifying means installed at the front end of the filter can be controlled based on variations of a signal inputted into the filter or based on variations of a signal outputted from the filter, so out-of-band signals of the filter may not exert an influence when a gain control is carried out.

In addition, according to a second aspect of the present invention, there is provided an automatic gain controller comprising: a first variable gain amplifying means, such as an AGC amplifier, for amplifying an input signal; a filter, such as an I-side channel filter or a Q-side channel filter, for limiting a band of an output signal of the first variable gain amplifying means; a second variable gain amplifying means, such as an AGC amplifier, for amplifying an output signal of the filter; a third variable gain amplifying means, such as an I-side AGC amplifier, a Q-side AGC amplifier or an AGC amplifier, for outputting the output signal of the filter by amplifying the output signal of the filter; a first control signal generating means, such as a first AGC control section, generating a first control signal for controlling a level of the output signal of the first variable gain amplifying means to a predetermined level; a second control signal generating means, such as a second AGC control section, generating a second control signal for controlling a level of an output signal of the second variable gain amplifying means to a predetermined level and outputting the second control signal to the second variable gain amplifying means; a third control signal generating means, such as a third AGC control section, having a response characteristic faster than a response characteristic of the second control signal generating means, generating a third control signal for controlling a level of an output signal of the third variable gain amplifying means to a predetermined level, and outputting the third control signal to the third variable gain amplifying means; and a control signal selecting means, such as an AGC response control section, selecting one of the first and second control signals generated from the first and second control signal generating means and outputting a selected control signal to the first variable gain amplifying means.

According to the automatic gain controller having the above structure, the control signal selecting means selects one of the first control signal generated from the first control signal generating means and the second control signal, which is generated from the second control signal generating means independent from the controller, in order to control the first variable gain amplifying means. Thus, the first variable gain amplifying means installed at the front end of the filter can be controlled based on variation of a signal inputted into the filter or based on variations of a signal outputted from the filter independent from the output signal of the controller, so out-of-band signals of the filter may not exert an influence when a gain control is carried out.

According to a third aspect of the present invention, each of the second and third control signal generating means includes a control information copying unit for copying control information of the second control signal generating means into the third control signal generating means when the control signal selecting means selects the second control signal generated from the second signal generating means and outputs the second control signal to the first variable gain amplifying means.

In the automatic gain controller having the above structure, when the first variable gain amplifying means installed at the front end of the filter is controlled based on variations of the signal outputted from the filter by using the second control signal generating means, control information of the second control signal generating means is copied into the third control signal generating means. In addition, a gain control is carried out with respect to the first, second and third variable gain amplifying means in accordance with a response speed of the second control signal generating means based on variations of the signal outputted from the filter. Thus, it is possible to prevent the third control signal generating means from being controlled with an unnecessarily high response speed while preventing the output signal of the controller from being distorted.

According to a fourth aspect of the present invention, the control information copying unit copies control information of the second control signal generating means into the third control signal generating means, when a variation value of the first control signal generated from the first control signal generating means per a unit time is less than a predetermined value.

According to the automatic gain controller having the above structure, since a strong signal out of a filter band may exist, the variation value of the first control signal generated from the first control signal generating means per a unit time is less than the predetermined value even if the control signal selecting means selects the first control signal and outputs the first control signal to the first variable gain amplifying means. In addition, the control information copying unit copies control information of the second control signal generating means into the third control signal generating means if it matches with the response characteristic for controlling the second variable gain amplifying means. In contrast, if the variation value of the first control signal per a unit time is greater than the predetermined value, the control information copying unit cannot copy control information. Thus, it is possible to prevent the output signal of the controller from being distorted, which is caused by a rapid response characteristic for the third variable gain amplifying means when gain variation of the first variable gain amplifier is small. In addition, when gain variation of the first variable gain amplifier is great, the response characteristic for the third variable gain amplifying means is not dependent on the gain variation, so the output signal of the controller is prevented from being distorted.

According to a fifth aspect of the present invention, the control signal selecting means compares the first control signal of the first control signal generating means with the second control signal of the second control signal generating means, and at the same time, selects one of the first and second control signals capable of lowering a gain of the first variable gain amplifying means, and outputs the selected signal to the first variable gain amplifying means.

The automatic gain controller having the above structure can easily select the control signal outputted to the first variable gain amplifying means by comparing the control signals with each other.

According to a sixth aspect of the present invention, a reference value varying means is provided for varying a reference value, which is compared with a level of an input signal, depending on a status of quality information, when quality information of a received signal is obtained from a signal demodulation section connected to a rear end of the automatic gain controller and when the first control signal generating means generates the first control signal based on a level of the input signal.

According to the automatic gain controller having the above structure, it is possible to balance the influence of an out-of-band signal and the in-band signal of the filter when gain control is carried out with respect to the in-band signal of the filter.

According to a seventh aspect of the present invention, the reference value varying means varies the reference value by comparing a level of the first control signal generated from the first control signal generating means with a level of the second control signal generated from the second control signal generating means, and by comparing a level of a received in-band signal with a predetermined value.

In the automatic gain controller having the above structure, if a level of the second control signal generated from the second control signal generating means is lower than a level of the first control signal generated from the first control signal generating means, and at the same time, a level of a received in-band signal is below a predetermined level, the reference value varying means varies the reference value so as to raise the level of the output signal of the first variable gain amplifying means. In addition, if the level of the second control signal generated from the second control signal generating means is lower than the level of the first control signal generated from the first control signal generating means, and at the same time, the level of the received in-band signal is higher than the predetermined level, the reference value varying means varies the reference value so as to lower the level of the output signal of the first variable gain amplifying means. Thus, if a desired signal receiving performance is not achieved, a reason thereof can be found by using the level of the received signal, so proper control may be carried out corresponding to the reason.

According to an eighth aspect of the present invention, a gain distribution adjusting means is provided to adjust a gain distribution in a front end circuit and a rear end circuit of the filter by comparing a level of an out-of-band signal of the filter with a level of an in-band signal of the filter.

The automatic gain controller having the above structure can properly determine the gain distribution in front and rear portions of the filter by comparing the signal levels of an out-of-band signal and an in-band signal of the filter with each other.

According to a ninth aspect of the present invention, a signal strength calculating means, such as a comparator, a switch, a subtractor, a variable gain amplifier, or an adder of the AGC response control section, is provided. If the first control signal generated from the first control signal generating means is control voltage V3, and the second control signal generated from the second control signal generating means is control voltage V1, and at the same time, if an overall gain characteristic with respect to the control voltage V1 is G(V1) and a gain characteristic of a front circuit of the filter with respect to the control voltage V1 is G3(V1), the signal strength calculating means determines the control voltage V1 as a strength of an in-band signal of the filter when the control voltage V3 is greater than the control voltage V1, and determines a calculating value V as the strength of the in-band signal of the filter when the control voltage V3 is less than the control voltage V1, wherein the calculating value V satisfies the following Equation 1:

$$V=V1+(G3(V1)/G(V1))(V1-V3)$$

The automatic gain controller having the above structure can easily measure the object signal level by using control signals generated from each control signal generating means.

BRIEF DESCRIPTION OF THE DRAWINGS

The above object and other features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings. In the following description of the present invention, a detailed description of known functions and configurations incorporated herein will be omitted when it may obscure the subject matter of the present invention.

Embodiment 1

First, an automatic gain controller according to a first embodiment of the present invention will be described.

A. Structure

Figure 1:
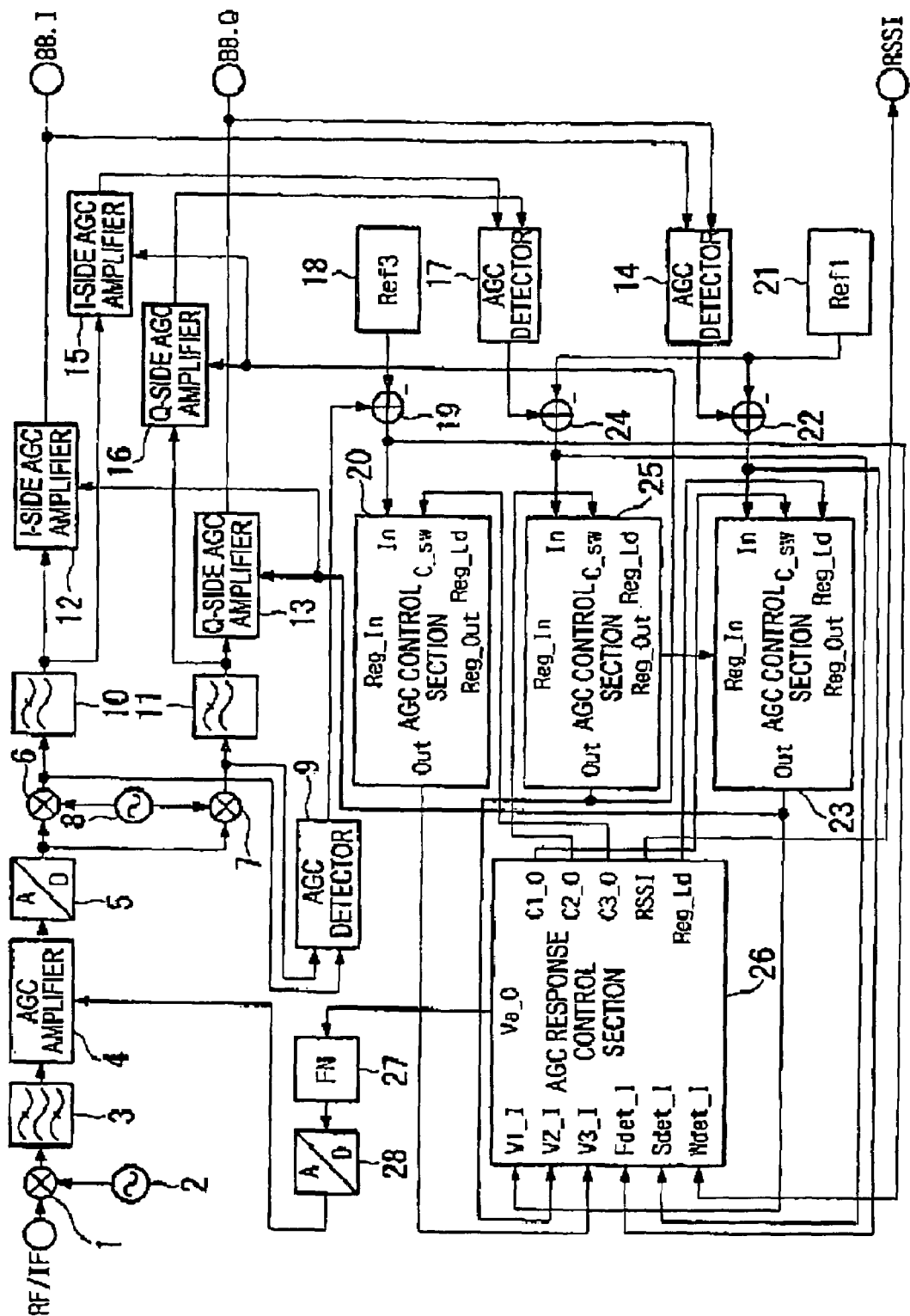
FIG. 1 is a block diagram showing a structure of a wireless apparatus having an automatic gain controller (AGC) according to a first embodiment of the present invention.

FIG. 1 is a block diagram showing a structure of a wireless apparatus having an automatic gain controller (AGC) according to the first embodiment of the present invention. Referring to FIG. 1, a signal inputted into a mixer 1 from an RF/IF terminal is converted into a signal having a low frequency (input IF frequency of A/D converter 5, which will be described later) in the mixer 1 by using a local signal having a first frequency, which is outputted from a local oscillator 2. Then, a signal having a predetermined frequency band is extracted from the signal outputted from the mixer by using a bandpass filter 3.

An AGC amplifier 4 is a variable gain amplifier for converting an output signal of the bandpass filter 3 into a signal having a constant level. The signal having the predetermined frequency band, which is converted into the signal having the constant level by the AGC amplifier 4, is inputted into the A/D converter 5 so that the signal is converted into a quantizing digital signal by means of the A/D converter 5.

In addition, an orthogonal detection is carried out with respect to the quantizing digital signal by using a local signal (cosine wave in I-side and –sine wave in Q-side) having a second frequency outputted from a digital local oscillator 8 of an I-side mixer 6 and a Q-side mixer 7 and is converted into a complex number signal having a baseband frequency represented by an I-axis signal and a Q-axis signal.

The complex number signal having the baseband frequency is inputted into an AGC detector 9. At the same time, the complex number signal is converted into a band signal of an objective band, due to bands of the I-axis signal and the Q-axis signal of the complex number signal being limited by an I-side channel filter 10 and a Q-side channel filter 11, respectively. In addition, the I-axis signal and the Q-axis signal are inputted into an I-side amplifier 12 and a Q-side amplifier 13, respectively. Since the AGC detector 9 generates a gain control signal for the AGC amplifier 4, the AGC detector 9 calculates square values of the I-axis signal and the Q-axis signal of the complex number signal having the baseband frequency and a square root value of the complex number signal. Variation of an output signal of the I-side mixer 6 and the Q-side mixer 7 is detected by integrating the square root value of the complex number signal.

In addition, I-side AGC amplifier 12 and Q-side AGC amplifier 13 are variable gain amplifiers for converting output signals of the I-side channel filter 10 and the Q-side channel filter 11 into signals having constant levels. Band signals of the objective bands, which are converted into signals having constant levels by the I-side AGC amplifier 12 and the Q-side AGC amplifier 13, are complex number signals BB.I and BB.Q having baseband frequencies, which are outputted from the wireless apparatus.

The band signals of the objective bands, which are converted into signals having constant levels by the I-side AGC amplifier 12 and the Q-side AGC amplifier 13, are inputted into an AGC detector 14. Since the AGC detector 14 generates a gain control signal for the I-side AGC amplifier 12 and the Q-side AGC amplifier 13, the AGC detector 14 calculates square values of the I-axis signal and the Q-axis signal of the band signals of the objective bands and square root values of the band signals. Variation of an output signal of the I-side AGC amplifier 12 and the Q-side AGC amplifier 13 is detected by integrating the square root values of the band signals.

In the same manner, bands of an I-axis signal and a Q-axis signal of the band signals of the objective bands are limited by the I-side channel filter 10 and the Q-side channel filter 11, respectively. In addition, the I-axis signal and the Q-axis signal are inputted into an I-side amplifier 15 and a Q-side amplifier 16, respectively. The I-side amplifier 15 and the Q-side amplifier 16 are variable gain amplifiers for converting output signals of the I-side channel filter 10 and the Q-side channel filter 11 into signals having constant levels. The band signals of the objective bands, which are converted into signals having constant levels by the I-side amplifier 15 and the Q-side amplifier 16, are inputted into an AGC detector 17.

In order to generate a gain control signal for the I-side amplifier 15 and the Q-side amplifier 16, the AGC detector calculates square values of the I-axis signal and the Q-axis signal of the band signals of the objective bands and square root values of the band signals. Variation of an output signal of the I-side amplifier 15 and the Q-side amplifier 16 is detected by integrating the square root values of the band signals.

The AGC detectors 9, 14 and 17 will be described in detail later.

The output signals of the AGC detectors 9, 14 and 17 are compared with reference values thereof in order to generate gain control signals for each amplifier. Comparative data are inputted into an AGC control section for generating the gain control signal for each amplifier. In detail, a reference value Ref3 outputted from a reference value register 18 is subtracted from an output signal of the AGC detector 9 by means of a subtractor 19 and a result thereof is inputted into an "In terminal" of an AGC control section 20.

In addition, a reference value Ref1 outputted from a reference value register 21 is subtracted from an output signal of the AGC detector 14 by means of a subtractor 22 and a result thereof is inputted into an "In terminal" of an AGC control section 23. Also, the reference value Ref1 outputted from the reference value register 21 is subtracted from an output signal of the AGC detector 17 by means of a subtractor 24 and a result thereof is inputted into an "In terminal" of an AGC control section 25 having response characteristics slower than response characteristics of the AGC control section 23.

Herein, the AGC control sections 20, 23 and 25 multiply input signals inputted into "In terminals" by a coefficient selected based on control signals inputted into "C_sw terminals" and output a result thereof to "Out terminals". In addition, the AGC control sections 20, 23 and 25 copy control information from "Reg_Out terminals" to "Reg_In terminals" based on control signals inputted into "Reg_Ld terminals". Referring to FIG. 1, the "Reg_Out terminal" of the AGC control section 25 is connected to the "Reg_In terminal" of the AGC control section 23, and control information of the AGC control section 25 is copied in the AGC control section 23 based on a control signal inputted into the "Reg_Ld terminal" of the AGC control section 23 from a signal output from the "Reg_Ld terminal" of AGC response control section 26.

The AGC control sections 20, 23 and 25 will be described in detail later. In the following description, functions of terminals which are not connected to the AGC control sections 20, 23 and 25 will not be discussed.

The "Out terminal" of the AGC control section 23 is connected to a "V1_I terminal" of AGC response control section 26 and gain control terminals of the I-side AGC amplifier 12 and the Q-side AGC amplifier 13 in such a manner that gains of the I-side AGC amplifier 12 and the Q-side AGC amplifier 13 can be controlled by means of an output signal of the "Out terminal" of the AGC control section 23. In addition, the "Out terminal" of the AGC control section 25 is connected to a "V2_I terminal" of the AGC response control section 26 and gain control terminals of the I-side AGC amplifier 15 and the Q-side AGC amplifier 16 in such a manner that gains of the I-side AGC amplifier 15 and the Q-side AGC amplifier 16 can be controlled by means of an output signal of the "Out terminal" of the AGC control section 25. The "Out terminal" of the AGC control section 20 is connected to a "V3_I terminal" of the AGC response control section 26.

AGC response control section 26 is a control section for controlling response characteristics of each AGC control section and generating a gain control signal for the AGC amplifier 4. In detail, a signal created by subtracting the reference value Ref3 of the reference value register 18 from the output signal of the AGC detector 9 in the subtractor 19 is inputted into a "Wdet_I terminal" of the AGC response control section 26. In the same manner, a signal created by subtracting the reference value Ref1 of the reference value register 21 from the output signal of the AGC detector 14 in the subtractor 22 is inputted into an "Fdet_I terminal" of the AGC response control section 26. In addition, a signal created by subtracting the reference value Ref1 of the reference value register 21 from the output signal of the AGC detector 17 in the subtractor 24 is inputted into an "Sdet_I terminal" of the AGC response control section 26.

Meanwhile, a "C1_O terminal" of the AGC response control section 26 is connected to a "C_sw terminal" of the AGC control section 23, a "C2_O terminal" of the AGC response control section 26 is connected to a "C_sw terminal" of the AGC control section 25 and a "C3_O terminal" of the AGC response control section 26 is connected to a "C_sw terminal" of the AGC control section 20. In addition, the "Reg_Ld terminal" of the AGC response control section 26 is connected to the "Reg_Ld terminal" of the AGC control section 23 so as to control the copying of the control signal from the AGC control section 25 to the AGC control section 23.

A "Va_O" terminal of the AGC response control section 26 outputs a gain control signal for the AGC amplifier 4. The gain control signal outputted from the "Va_O" terminal of the AGC response control section 26 is converted into an analog signal by means of a D/A converter through a function block 27 capable of finely adjusting response characteristics of the automatic gain controller according to the present invention and is inputted into a gain control terminal of the AGC amplifier 4. The AGC response control section 26 will be described in detail later.

In addition, the wireless apparatus includes a controller (not shown) controlling the function block 27 and updating reference values of each reference value register and internal register values determining the response characteristic of each AGC control section.

B. AGC Detector

Hereinafter, AGC detectors 9, 14 and 17 of the automatic gain controller according to the first embodiment of the present invention will be described in detail with reference to accompanying drawings. The AGC detectors 9, 14 and 17 have the same structure as each other, and FIG. 2 shows a structure of a complex input type AGC detector.

Figure 2:
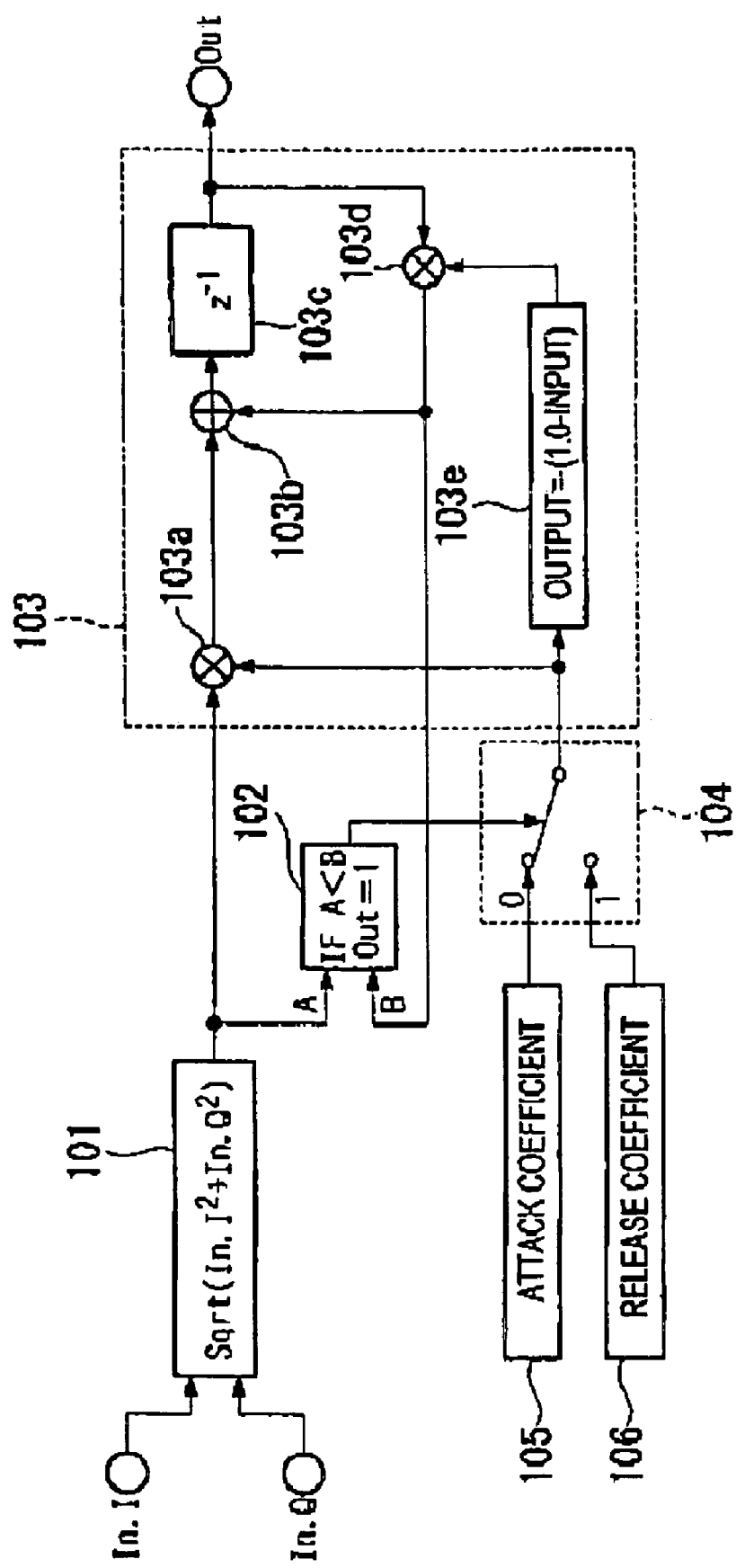
FIG. 2 is a block diagram showing a structure of an AGC detector (complex input) of an automatic gain controller according to the first embodiment of the present invention.

Referring to FIG. 2, as a complex signal is inputted through an "In.I terminal" and an "In.Q terminal", an amplitude calculator 101 calculates square values of an I-axis signal and a Q-axis signal and adds the square values to the complex signal. At the same time, a square root value of the complex signal is calculated. An output signal of the amplitude calculator 101 is simultaneously inputted into a comparator 102 and an integrator 103 including a multiplier 103*a*, an adder 103*b*, a delay unit 103*c*, a multiplier 103*d*, and a coefficient calculator 103*e*.

Herein, the integrator 103 integrates an output signal of the amplitude calculator 101 based on any one of an attack coefficient outputted from an attack coefficient register 105 and a release coefficient outputted from a release coefficient register 106 (wherein, an attack coefficient value is larger than a release coefficient value), which are selected by a switch 104 controlled by means of an output signal of the comparator 102. In detail, the output signal of the amplitude calculator 101 inputted into the integrator 103 is multiplied by one of the attack coefficient and the release coefficient, which are inputted into the integrator 103 as numerator coefficients, by means of the multiplier 103*a*.

In addition, a denominator coefficient of the attack coefficient or the release coefficient inputted into the integrator 103 is calculated by means of the coefficient calculator 103*e*. An output signal of the coefficient calculator 103*e* is multiplied by an output signal of the integrator 103 through the multiplier 103*d* and the result is added to an output signal of the multiplier 103*a* by means of the adder 103*b*. Meanwhile, an output signal of the adder 103*b* is outputted through an "Out terminal" via the delay unit 103*c* as an output signal of the integrator 103, that is, as an output signal of the AGC detector.

The comparator 102 compares the output signal of the amplitude calculator 101 with an output signal of the multiplier 103*d*. If the output signal of the amplitude calculator 101 is smaller than the output signal of the multiplier 103*d*, the switch 104 selects the release coefficient so as to enlarge an integrate time constant. If the output signal of the amplitude calculator 101 is larger than the output signal of the multiplier 103*d*, the switch 104 selects the attack coefficient so as to reduce the integration time constant. Thus, the value of the output signal of the integrator 103 may be between an effective value and a peak value of an input signal.

C. AGC Control Section

Figure 3:
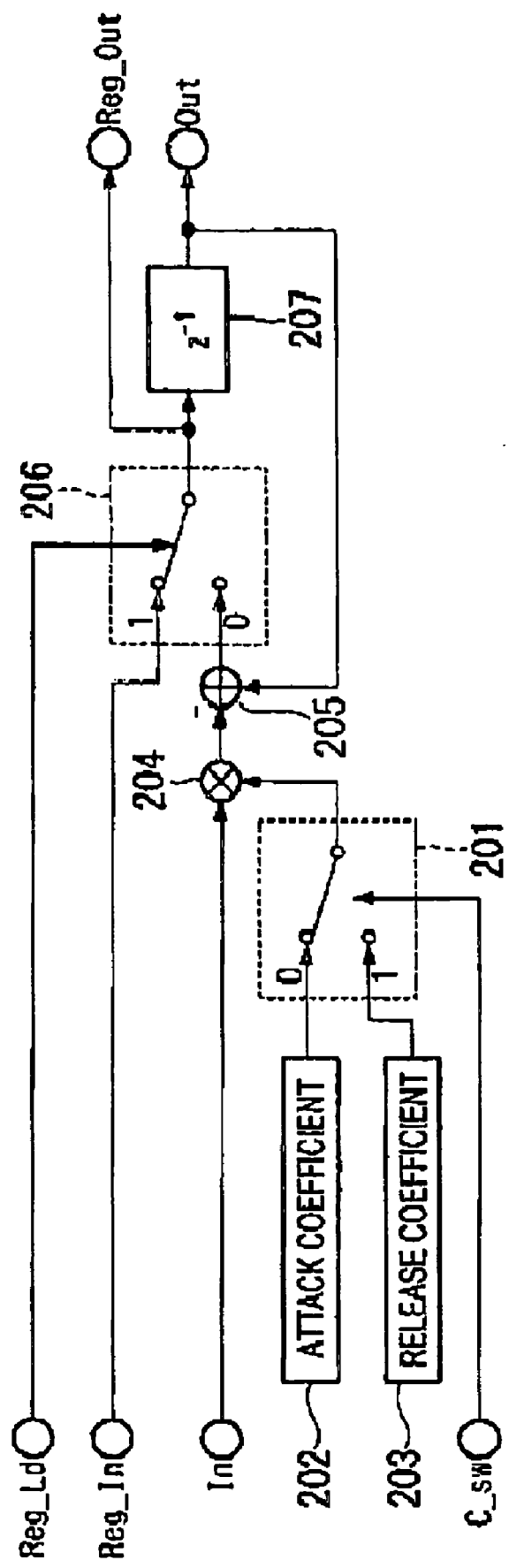
FIG. 3 is a block diagram showing a structure of an AGC control section according to the first embodiment of the present invention.

Hereinafter, AGC control sections 20, 23, and 25 of the automatic gain controller according to the first embodiment of the present invention will be described in detail with reference to accompanying drawings. The AGC control sections 20, 23 and 25 have the same structure as each other. FIG. 3 is a block diagram showing the structure of the AGC control section of the automatic gain controller.

Referring to FIG. 3, an input signal inputted through an "In terminal" is multiplied by any one of an attack coefficient and a release coefficient (wherein, an attack coefficient value is larger than a release coefficient value) through a multiplier 204, in which the release coefficient is outputted from a release coefficient register 203 and the attack coefficient is outputted from an attack coefficient register 202 according to a selection of a switch 201 which is controlled based on a control signal inputted into a "C_sw terminal".

In addition, an output signal of the multiplier 204 is subtracted from an output signal of the AGC control section by means of a subtractor 205 and inputted into a switch 206.

The switch 206 selects any one of an output signal of the subtractor 205 and an input signal inputted into an "Reg_In terminal" based on a control signal inputted into an "Reg_Ld terminal". The selected signal is outputted through a "Reg_Out terminal" and is inputted into a delay unit 207. In addition, an output signal of the delay unit 207 is outputted through an "Out terminal" as an output signal of the AGC control section.

The switch 201 selects the attack coefficient outputted from the attack coefficient register 202 if the control signal inputted into the "C-sw terminal" is "0" and selectively outputs the release coefficient outputted from the release coefficient register 203 if the control signal inputted into the "C-sw terminal" is "1".

In addition, the switch 206 selects the output signal of the subtractor 205 if the control signal inputted into the "Reg_Id terminal" is "0" and selectively outputs an input signal inputted into the "Reg_In terminal" if the control signal inputted into the "Reg-Ld terminal" is "1".

D. AGC Response Control Section

Figure 4:
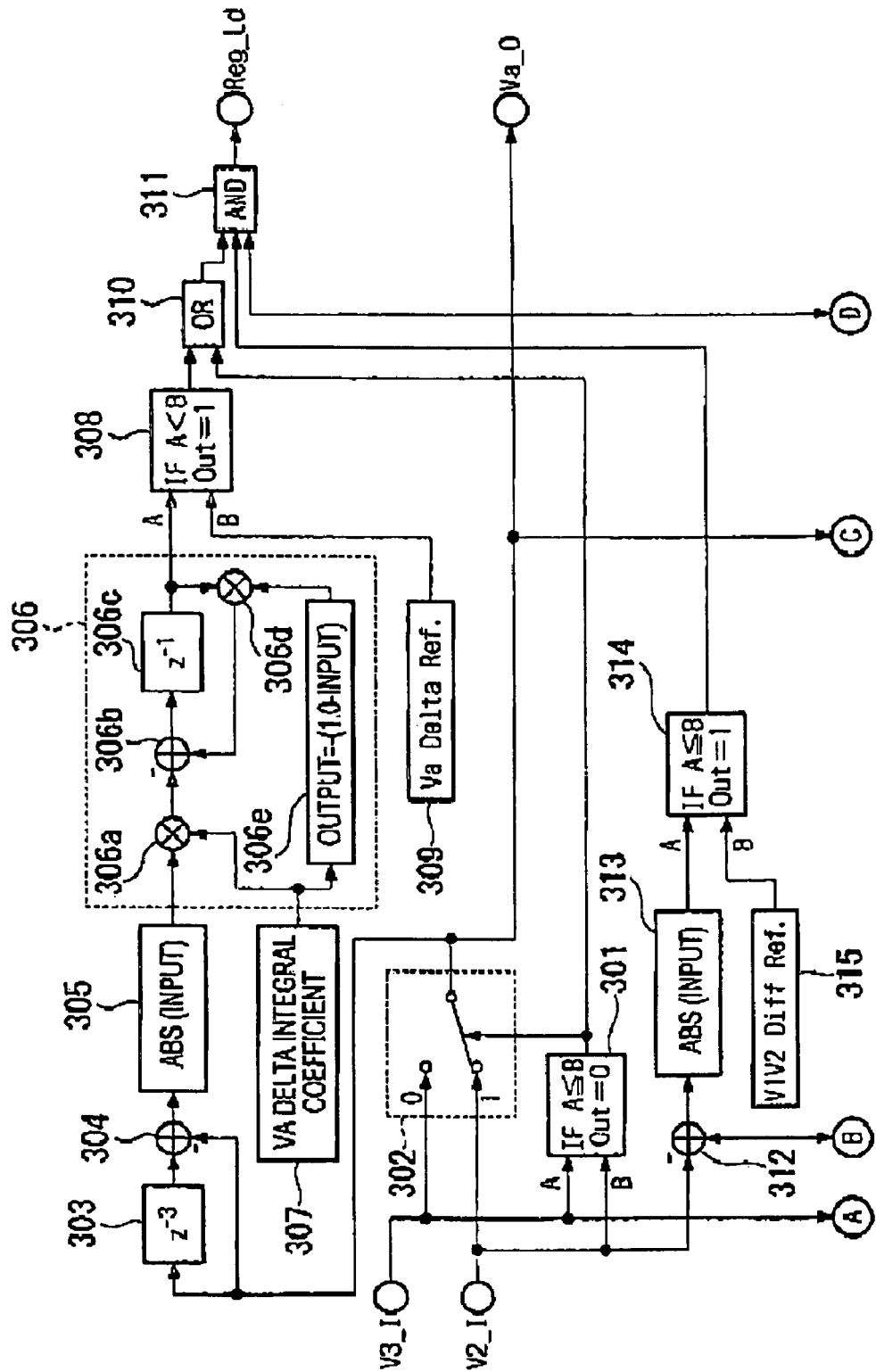
FIG. 4 is a block diagram showing a structure of an AGC response control section of an automatic gain controller according to the first embodiment of the present invention.
Figure 5:
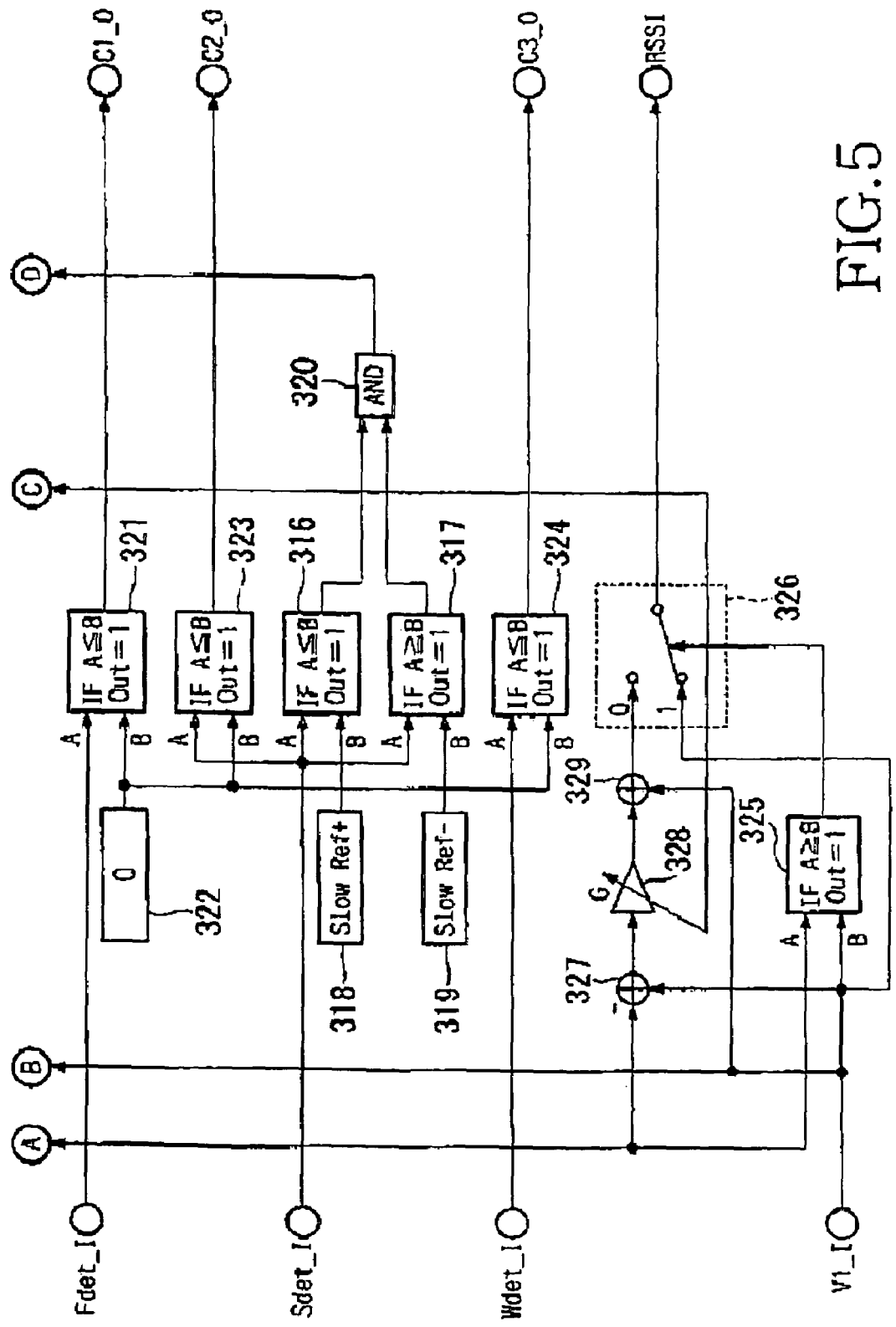
FIG. 5 is a block diagram showing a structure of an AGC response control section of an automatic gain controller according to the first embodiment of the present invention.

Hereinafter, the AGC response control sections 26 of the automatic gain controller according to the first embodiment of the present invention will be described in detail with reference to accompanying drawings. FIGS. 4 and 5 are block diagrams showing a structure of the AGC response control section of the automatic gain controller according to a first embodiment of the present invention.

Referring to FIGS. 4 and 5, signals inputted through the "V2_I terminal" and the "V3_I terminal" are compared with each other by means of a comparator 301. At the same time, one of the signals inputted through the "V2_I terminal" and the "V3_I terminal" is selected by a switch 302, which is controlled and switched by means of an output signal of the comparator 301, and the selected signal is outputted to the "Va_O terminal".

In addition, if the signal inputted into the "V3_I terminal" is lower than the signal inputted into the "V2_I terminal", the comparator 301 outputs "0", and the switch 302 outputs the signal inputted into the "V3_I terminal" through the "Va_O terminal".

If the signal inputted into the "V3_I terminal" is larger than the signal inputted into the "V2_I terminal", the comparator 301 outputs "1", and the switch 302 outputs the signal inputted into the "V2_I terminal" through the "Va_O terminal".

In addition, an output signal of the switch 302 is delayed by a delay unit 303. At the same time, the output signal of the switch 302 delayed by the delay unit 303 is differentiated by subtracting the output signal of the switch 302 from the delayed output signal of the switch 302 by means of a subtractor 304. In addition, an absolute value of the output signal of the switch 302 is calculated by means of an absolute value calculator 305.

An output signal of the absolute value calculator 305 is inputted into an integrator 306 including a multiplier 306a, an adder 306b, a delay unit 306c, a multiplier 306d and a coefficient calculator 306e.

Herein, the integrator 306 is designed to integrate the output signal of the absolute value calculator 305 based on a "Va Delta integral coefficient" outputted from a Va Delta integral coefficient register 307. In detail, the output signal of the absolute value calculator 305 inputted into the integrator 306 is multiplied by the "Va Delta integral coefficient" inputted into the integrator 306 as a numerator coefficient of the integrator by means of the multiplier 306a.

In addition, a denominator coefficient of the "Va Delta integral coefficient" inputted into the integrator 306 is calculated by means of the coefficient calculator 306e. An output signal of the coefficient calculator 306e is multiplied by the output signal of the integrator 305 by means of the multiplier 306d and a result thereof is added to an output signal of the multiplier 306a by means of the adder 306b. An output signal of the adder 306b passes through the delay unit 306 and is outputted as an output signal of the integrator 306. Accordingly, a variation degree of a signal outputted to the "Va_O terminal" can be calculated.

The output signal of the integrator 306 is inputted into a comparator 308 so that the output signal of the integrator 306 is compared with a reference value "Va Delta Ref." outputted from a Va reference value register 309. The comparator 308 outputs "1" if the output signal of the integrator 306, that is the variation degree of the signal outputted to the "Va_O terminal" is smaller than the reference value "Va Delta Ref.".

Meanwhile, a logical sum (OR) of the output signals of the comparators 301 and 308 is obtained from an OR circuit 310 and is inputted into an AND circuit 311 located in front of the OR circuit 310. Thus, if the signal inputted into the "V3_I terminal" is larger than the signal inputted into the "V2_I terminal", or if the variation degree of the signal outputted to the "Va_O terminal" is smaller than the reference value "Va Delta Ref.", "1" is inputted into the AND circuit 311.

In addition, the signal inputted through the "V2_I terminal" is subtracted from the signal inputted through the "V1_I terminal" by means of a subtractor 312. At the same time, an output signal of the subtractor 312 is inputted into an absolute value calculator 313 so that an absolute value of the output signal of the subtractor 312 is calculated. In addition, an output signal of the absolute value calculator 313 is inputted into a comparator 314 so that the output signal of the absolute value calculator 313 is compared with a reference value "V1 V2 Diff Ref." outputted from a V1–V2 differential value register 315.

If an absolute value of a differential value between the signal inputted into the "V1_I terminal" and the signal inputted into the "V2_I terminal" is lower than the reference value "V1 V2 Diff Ref.", an output signal of the comparator 314 becomes "1" and "1" is inputted into the AND circuit 311. In addition, if the absolute value of the differential value between the signal inputted into the "V1_I terminal" and the signal inputted into the "V2_I terminal" is larger than the reference value "V1 V2 Diff Ref.", the output signal of the comparator 314 becomes "0" and "0" is inputted into the AND circuit 311.

Meanwhile, the signal inputted into the "Sdet_I terminal" is compared with a reference value "Slow Ref+" outputted from a register 318 capable of checking an upper limit value of a control signal by means of a comparator 316, and is compared with a reference value "Slow Ref−" outputted from a register 319 capable of checking a lower limit value of a control signal by means of a comparator 317. In addition, output signals of the comparators 316 and 317 are inputted into the AND circuit 311 via an AND circuit 320.

In addition, the output signal of the comparator 316 becomes "1" if the signal inputted into the "Sdet_I terminal" is lower than the reference value "Slow Ref+" and the output signal of the comparator 317 becomes "1" if the signal inputted into the "Sdet_I terminal" is greater than the reference value "Slow Ref−", "1" is inputted into the AND circuit 311 via the AND circuit 320 if the signal inputted into the "Sdet_I terminal" is in a range between the reference value "Slow Ref+" and the reference value "Slow Ref−".

The output signal of the comparator 316 becomes "0" if the signal inputted into the "Sdet_I terminal" is greater than the reference value "Slow Ref+" and the output signal of the comparator 317 becomes "0" if the signal inputted into the "Sdet_I terminal" is lower than the reference value "Slow Ref−", "0" is inputted into the AND circuit 311 via the AND circuit 320.

In addition, a logical multiply (AND) of the output signals of the OR circuit 310 and the comparators 314 and 320 is obtained from the AND circuit 311 and an output signal of the AND circuit 311 is outputted to the "Reg_Ld terminal".

The signal inputted into the "Fdet_I terminal" is compared with a reference value "0" outputted from a zero register 322 by means of a comparator 321. At this time, if the signal inputted into the "Fdet_I terminal" is below the reference value "0", an output signal of the comparator 321 becomes "1" and is outputted to the "C1_O terminal". In addition, if the signal inputted into the "Fdet_I terminal" is greater than the reference value "0", the output signal of the comparator 321 becomes "0" and is outputted to the "C1_O terminal".

The signal inputted into the "Sdet_I terminal" is compared with the reference value "0" outputted from the zero register 322 by means of a comparator 323. At this time, if the signal inputted into the "Sdet_I terminal" is below the reference value "0", an output signal of the comparator 323 becomes "1" and is outputted to the "C2_O terminal". In addition, if the signal inputted into the "Sdet_I terminal" is greater than the reference value "0", the output signal of the comparator 323 becomes "0" and is outputted to the "C2_O terminal".

In addition, the signal inputted into the "Wdet_I terminal" is compared with the reference value "0" outputted from the zero register 322 by means of a comparator 324. At this time, if the signal inputted into the "Wdet_I terminal" is below the reference value "0", an output signal of the comparator 324 becomes "1" and is outputted to the "C3_O terminal". In addition, if the signal inputted into the "Wdet_I terminal" is greater than the reference value "0", the output signal of the comparator 324 becomes "0" and is outputted to the "C3_O terminal".

The signals inputted into the "V1_I terminal" and the "V3_I terminal" are compared with each other by means of a comparator 325. At the same time, the signal inputted into the "V1_I terminal" or a signal, which is created by compensating for the signal inputted into the "V1_I terminal" by using the signal inputted into the "V3_I terminal", is selected by a switch 326 which is controlled and switched by means of an output signal of the comparator 325. Then, the selected signal is outputted as an RSSI (Received Signal Strength Indicator) signal through an "RSSI terminal".

When the signal inputted into the "V3_I terminal" is greater than the signal inputted into the "V1_I terminal", the output signal of the comparator 325 becomes "1", so the switch 326 outputs the signal inputted into the "V1_I terminal" through the "RSSI terminal". In addition, if the signal inputted into the "V3_I terminal" is smaller than the signal inputted into the "V1_I terminal", the output signal of the comparator 325 becomes "0", so the switch 326 outputs the signal, which is created by compensating for the signal inputted into the "V1_I terminal" by using the signal inputted into the "V3_I terminal", through the "RSSI terminal".

In addition, following Equation 2 can be obtained in order to compensate for the signal inputted into the "V1_I terminal" by using the signal inputted into the "V3_I terminal", in which signals of each terminal are represented as terminal names.

$$\text{``RSSI''}=\text{``V1\_I''}+(G3(V1)/G(V1))\,(\text{``V1\_I''}-\text{``V3\_I''}). \quad \text{Equation 2}$$

In detail, ("V1_I"–"V3_I") is calculated by a subtractor 327, an output signal of the subtractor 327 is multiplied by a coefficient (G3(V1)/G(V1)) by means of a variable gain amplifier 328, and "V1_I" is added thereto by means of an adder 329, thereby obtaining the above equation.

E. Characteristic of AGC Amplifiers

Hereinafter, the characteristic of the AGC amplifiers used in the automatic gain controller according to the first embodiment of the present invention will be described with reference to accompanying drawings.

Figure 6:
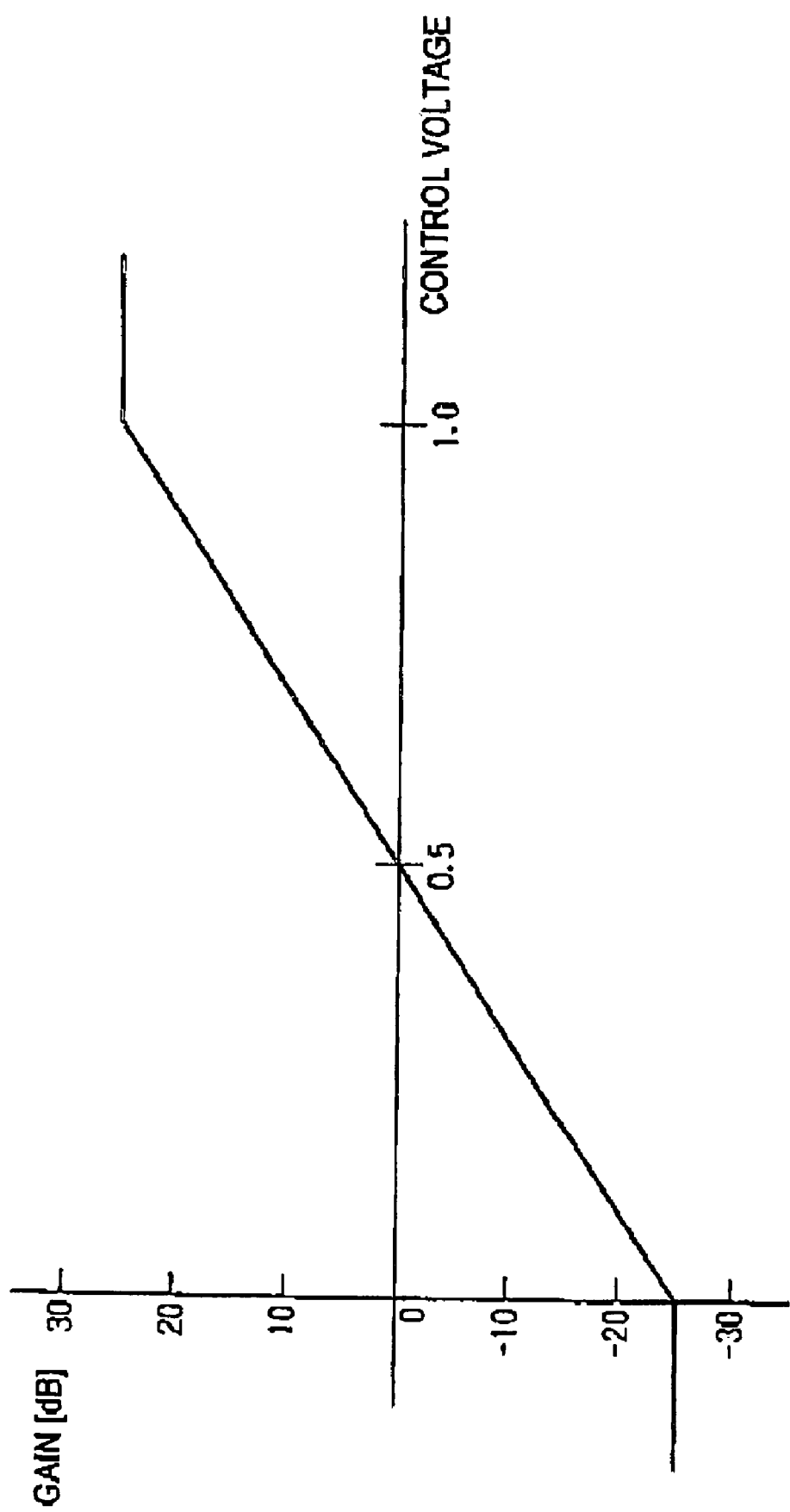
FIG. 6 is a graph showing an example of a gain characteristic of an AGC amplifier as a function of control voltage when the AGC amplifier is installed at a rear end of a channel filter of an automatic gain controller according to the first embodiment of the present invention.

FIG. 6 is a graph showing an example of a gain characteristic as a function of control voltage in the I-side AGC amplifier 12, Q-side AGC amplifier 13, I-side AGC amplifier 15, and Q-side AGC amplifier 16. According to the characteristic of each AGC amplifier, the gain is constantly maintained at −25 [dB] when the control voltage is below 0.0, and is constantly maintained at −25 [dB] when the control voltage is above 1.0. When the control voltage is in a range between 0.0 and 1.0, the gain increases by 5 [dB] as the control voltage increases by 0.1. In addition, the gain becomes 0 [dB] when the control voltage becomes 0.5.

Figure 7:
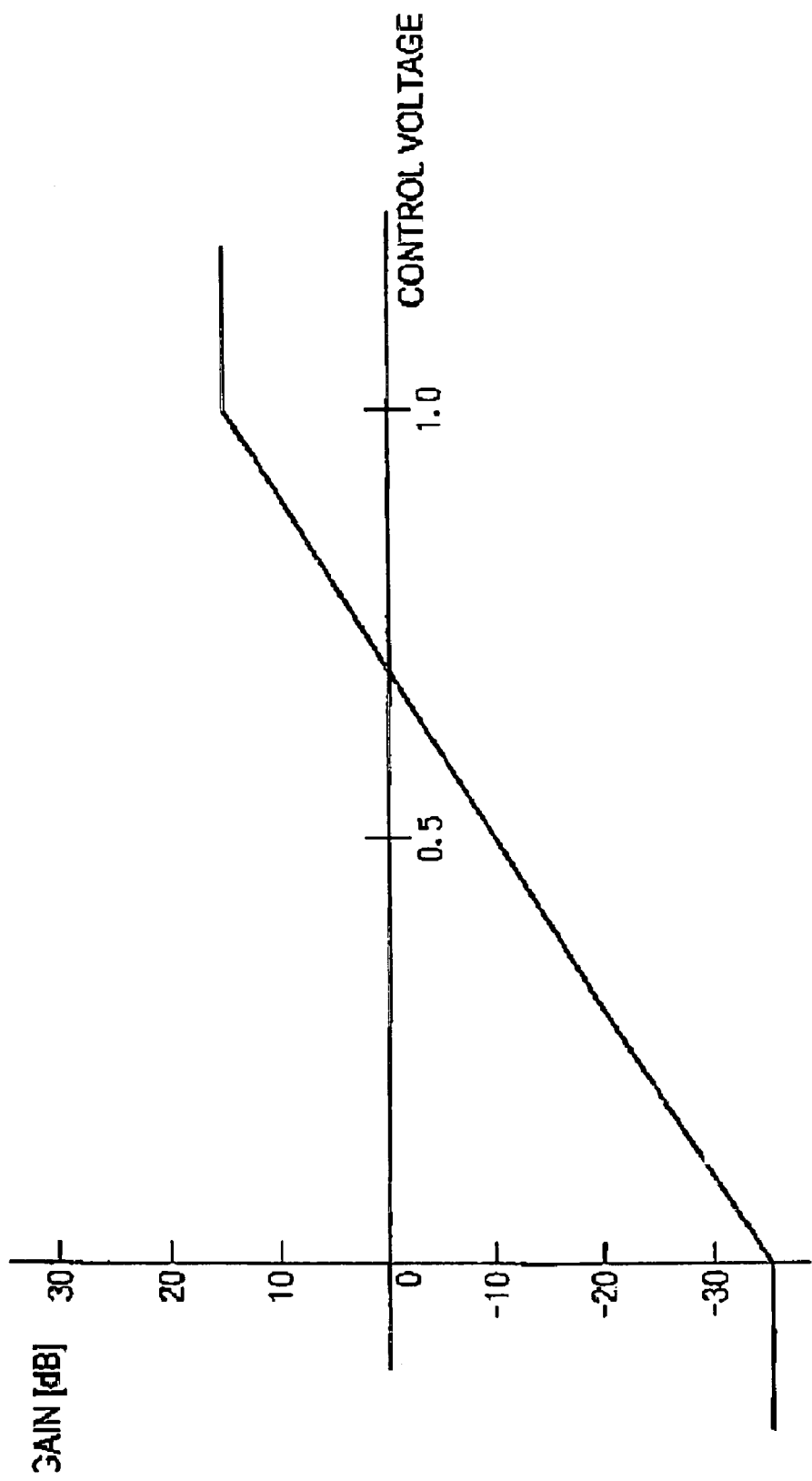
FIG. 7 is a graph showing an example of a gain characteristic of an AGC amplifier as a function of control voltage when the AGC amplifier is installed at a front end of a channel filter of an automatic gain controller according to the first embodiment of the present invention.

FIG. 7 is a graph showing an example of a gain characteristic as a function of control voltage in the AGC amplifier 4. According to the characteristic of the AGC amplifier 4, a gain is constantly represented as −35 [dB] when the control voltage is below 0.0 and is constantly represented as 15 [dB] when the control voltage is above 1.0. In addition, when the control voltage is in a range between 0.0 and 1.0, the gain increases by 5 [dB] as the control voltage increases by 0.1. Meanwhile, the gain becomes 0 [dB] when the control voltage becomes 0.7.

F. Operation of Automatic Gain Controller

Hereinafter, an operation of the automatic gain controller having the above-mentioned structure according to the first embodiment of the present invention will be described. The automatic gain controller of the present invention includes a first AGC loop and a second AGC loop installed at rear ends of the I-side channel filter 10 and the Q-side channel filter 11, respectively. The first AGC loop includes the I-side AGC amplifier 12, the Q-side AGC amplifier 13, the AGC detector 14 and the AGC control section 23 and performs a high-speed response. The second AGC loop includes the I-side AGC amplifier 15, the Q-side AGC amplifier 16, the AGC detector 17 and the AGC control section 25 and performs a low-speed response with a low signal distortion. An output signal of the automatic gain controller is extracted from the first AGC loop.

In addition, a third AGC loop including the AGC amplifier 4, the AGC detector 9, and the AGC control section 20 is installed at front ends of the I-side channel filter 10 and the Q-side channel filter 11 in order to detect an overall signal level before out-of-band signals of objective bands are restricted by the I-side channel filter 10 and the Q-side channel filter 11.

At this time, the AGC response control section 26 controls the AGC amplifier 4, by means of control voltage outputted from the AGC control section 20, if the overall signal level before the out-of-band signals of the objective bands are restricted is larger than a predetermined value, in such a manner that the AGC response control section 26 may control the AGC amplifier 4 only when the overall signal level exceeds the predetermined value, by considering the bands of the I-side channel filter 10 and the Q-side channel filter 11 and the overall signal level inputted into the automatic gain controller. Meanwhile, if the overall signal level before the out-of-band signals of the objective bands are restricted is lower than the predetermined value, the AGC response control section 26 controls the AGC amplifier 4 by means of control voltage outputted from the AGC control section 25.

In detail, a level of the control voltage outputted from the AGC control section 25 and inputted into the "V2_I terminal" is compared with a level of the control signal outputted from the AGC control section 20 and inputted into the "V3_I terminal" by means of the AGC response control section 26. In addition, the AGC response control section 26 controls the AGC amplifier 4 by using the control voltage ("V3_I terminal signal) outputted from the AGC control section 20, if the control voltage ("V3_I terminal signal) outputted from the AGC control section 20 is lower than the control voltage ("V2_I terminal signal) outputted from the AGC control section 25.

Meanwhile, if the control voltage ("V3_I terminal signal) outputted from the AGC control section 20 is greater than the control voltage ("V2_I terminal signal) outputted from the AGC control section 25, the AGC response control section 26 controls the AGC amplifier 4 by using the control voltage ("V2_I terminal signal) outputted from the AGC control section 25.

That is, the AGC response control section 26 selects a control signal capable of lowering the gain of the AGC amplifier 4 and outputs the control signal to the AGC amplifier 4.

Accordingly, if the levels of the in-band signals of the I-side channel filter 10 and the Q-side channel filter 11 are lower than the levels of out-of-band signals of the filter inputted into the automatic gain controller, the AGC response control section 26 may control the AGC amplifier 4 by means of the control voltage outputted from the AGC control section 20, which is dependent on the overall signal level including out-of-band signals of the filter, so that the control voltage outputted from the AGC control section 25 may restrict an increase of the gain of the AGC amplifier 4 which is required to increase the level of the in-band signal of the I-side channel filter 10 and the Q-side channel filter 11 to a predetermined level. Thus, the overall signal level including the out-of-band signals of the filter can be restricted within a predetermined value.

Therefore, signal saturation of the AGC amplifier created at the front ends of the I-side channel filter 10 and the Q-side channel filter 11 due to out-of-band signals of the filter or signal distortion caused by characteristics of a non-linear area of the AGC amplifier can be prevented. In addition, if the gain of the AGC amplifier 4 is restricted by means of the control voltage outputted from the AGC control section 20, the AGC loop is operated with the signal level including out-of-band signals of the filter, so a level of an object signal is lowered as compared with an original signal level thereof At this time, the level of the object signal is compensated by a gain control of the I-side AGC amplifier 12 and the Q-side amplifier 13 installed at the rear ends of the I-side channel filter 10 and the Q-side channel filter 11 so that the original signal level is outputted.

G. Variation of Response Speed of AGC Control Section

If it is unnecessary for the first AGC loop including the I-side AGC amplifier 12, the Q-side AGC amplifier 13, the AGC detector 14 and the AGC control section 23 to perform a high-speed response with respect to the output signal of the AGC amplifier 4, the first AGC loop can copy control information of the second AGC loop, which performs the low-speed response with low signal distortion and includes the I-side AGC amplifier 15, the Q-side AGC amplifier 16, the AGC detector 17 and the AGC control section 25, thereby lowering the response characteristic of the first AGC loop and reducing signal distortion thereof In detail, if the AGC response control section 26 is satisfied with the following three conditions (AND conditions), "1" is outputted to the "Reg_Ld terminal", the control signal of the AGC control section 25 is inputted into the "Reg_In terminal" of the AGC control section 23 from the "Reg_Out terminal" of the AGC control section 25, and the AGC control section 23 outputs the control signal to the "Out terminal".

(Condition 1)

A strong signal may exist out of a filter band, and the variation degree of a signal outputted from the "Va_O terminal" is at least lower than the reference value "Va Delta Ref.", even if the control voltage ("V3_I terminal signal") outputted from the AGC control section 20 is lower than the control voltage ("V2_I terminal signal") outputted from the AGC control section 25.

Otherwise, a strong signal out of the filter band may not exist and the control voltage ("V2_I terminal signal") outputted from the AGC control section 25 is lower than the control voltage ("V3_I terminal signal") outputted from the AGC control section 20.

(Condition 2)

Signal variation in the filter is very small, and a differential value between the control voltage ("V1_I terminal signal") outputted from the AGC control section 23 and the control voltage ("V2_I terminal signal") outputted from the AGC control section 25 is lower than the reference value "V1 V2 Diff Ref." outputted from the V1–V2 differential value register 315.

(Condition 3)

The control signal is received in second AGC loop performing the low-speed response and including the I-side AGC amplifier 15, the Q-side AGC amplifier 16, the AGC detector 17 and the AGC control section 25, and the signal inputted into the "Sdet_I terminal" is higher than the reference value "Slow Ref–" and is lower than the reference value "Slow Ref+".

H. Gain Distribution Control Based on Variation of Reference Value

When it is possible to obtain quality information of a received signal from a signal demodulation section connected to a rear end of the automatic gain controller, it is necessary to prevent signal receiving performance from deterioration caused by the signal distortion and an inferior SNR (signal to noise ratio). In addition, it is necessary to update the reference value "Ref3" outputted from the reference value register 18 and subtracted from the output signal of the AGC detector 9 by means of the subtractor 19 based on obtained quality information and to perform a level distribution control with respect to the AGC amplifiers installed at front and rear ends of the I-side channel filter 10 and the Q-side channel filter 11.

In detail, the control section (not shown) controlling the function block 27 and updating the reference value of each reference value register or internal register values determining the response characteristic of each AGC control section, obtains quality information of the received signal, such as a BER (bit error rate) of the received signal, the SNR and a constellation of a signal, and calculates a mean value of quality information of the received signal.

At this time, if the mean value of the BER is less than the reference value "Ref4" and a bad BER is represented, and if a bad SNR is represented when the SNR is less than the reference value "Ref5", it is determined that the bad BER is derived from an insufficient SNR so that an output signal level of the AGC amplifier 4 must be maximized and the reference value "Ref3" is changed.

In detail, if the control voltage ("V3_I terminal signal) outputted from the AGC control section 20 is less than the control voltage ("V1_I terminal signal") outputted from the AGC control section 23, and at the same time, if the control voltage ("V1_I terminal signal) outputted from the AGC control section 23 or the RSSI signal calculated from the AGC response control section 26 is greater than the reference value "Ref6", the reference value "Ref3" is increased so as to raise the output signal level of the AGC amplifier 4.

Meanwhile, if the SNR is higher than the reference value "Ref5" under the condition that the mean value of the BER is less than the reference value "Ref4" representing the bad BER, and the constellation is greater than the reference value "Ref7" occurring with great distortion, it is determined that the signal distortion occurs in the AGC amplifier 4 or in the A/D converter 5, so that the output signal level of the AGC amplifier 4 must be minimized and the reference value "Ref3" is changed.

In detail, if the control voltage ("V3_I terminal signal) outputted from the AGC control section 20 is less than the control voltage ("V1_I terminal signal) outputted from the AGC control section 23, and at the same time, if the control voltage ("V1_I terminal signal) outputted from the AGC control section 23 or the RSSI signal calculated from the AGC response control section 26 is less than the reference value "Ref6", the reference value "Ref3" is decreased so as to reduce the output signal level of the AGC amplifier 4.

Accordingly, the gain distribution control at front and rear ends of the I-side channel filter 10 and the Q-side channel filter 11 is carried out in match with a PAR (peak to average ratio) of the out-of-band signals and variation of a signal receiving status caused by a paging in such a manner that the signal receiving performance is prevented from deterioration caused by the signal distortion and the bad SNR, thereby effectively utilizing a limited dynamic range.

I. Method of Changing Gain Distribution by Using Function Block

The level distribution control for the AGC amplifiers installed at front and rear ends of the I-side channel filter 10 and the Q-side channel filter 11 can be carried out by changing a function FN(x) according to levels of signals inputted into the automatic gain controller of the present invention, that is according to a ratio of levels of in-band signals of the I-side channel filter 10 and the Q-side channel filter 11 to levels of out-of-band signals of the filter by using the function block 27.

In detail, the function FN(x) may be represented as a simple gain or as a poly-nominal expression. First, a case in which the FN(x) is the simple gain will be described.

If the function FN(x) is a simple gain, the function FN(x) satisfies the following Equations 3 and 4.

$$Y=ax \qquad \text{Equation 3}$$

Wherein, "a" is equal to or greater than "1".

$$Y=x+a \qquad \text{Equation 4}$$

Wherein, "a" is greater than "−1" and less than "1".

At this time, in the control section (not shown) controlling the function block 27 and updating the reference value of each reference value register or internal register values determining the response characteristic of each AGC control section, if a status continuously occurs, in which the control voltage ("V3_I terminal signal) outputted from the AGC control section 20 is less than the control voltage ("V1_I terminal signal) outputted from the AGC control section 23, and at the same time, the control voltage ("V1_I terminal signal) outputted from the AGC control section 23 or the RSSI signal calculated from the AGC response control section 26 is less than the reference value "Ref6", the number of such statuses is counted. In addition, if the number of such statuses per a predetermined time exceeds a predetermined number, a coefficient "a" of the above function FN(x) is decreased.

Meanwhile, if a status continuously occurs, in which the control voltage ("V3_I terminal signal) outputted from the AGC control section 20 is less than the control voltage ("V1_I terminal signal) outputted from the AGC control section 23, and at the same time, the control voltage ("V1_I terminal signal) outputted from the AGC control section 23 or the RSSI signal calculated from the AGC response control section 26 is greater than the reference value "Ref6", the number of such statuses is counted. In addition, if the number of such statuses per a predetermined time exceeds a predetermined number, a coefficient "a" of the above function FN(x) is increased.

In addition, if the function FN(x) is represented as the poly-nominal expression, the function FN(x) satisfies the following Equation 5.

$$Y=a0+a1x+a2x^2+a3x^3 \qquad \text{Equation 5}$$

Figure 8:
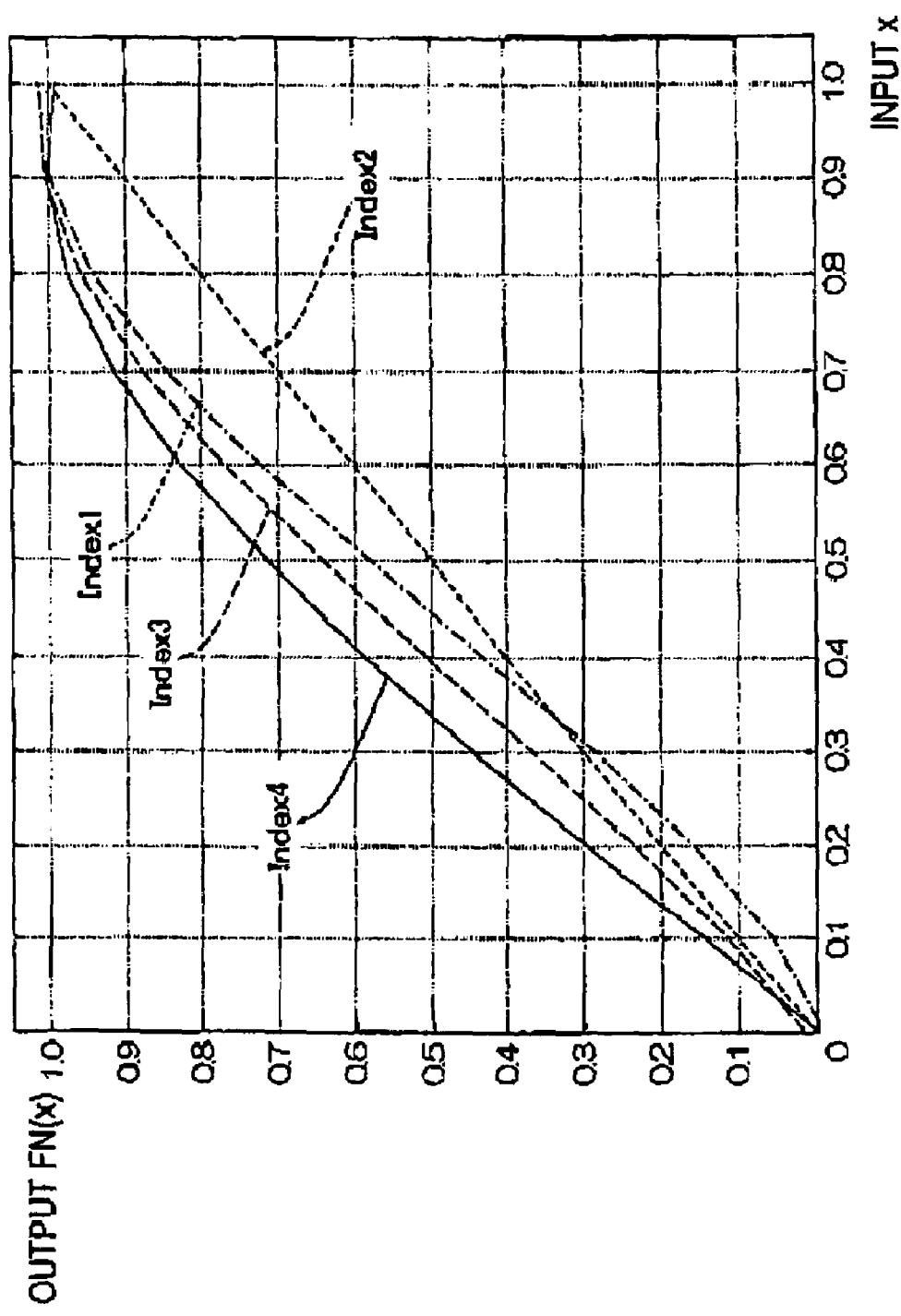
FIG. 8 is a graph showing an example of a function FN(x) characteristic in a function block of an automatic gain controller according to the first embodiment of the present invention.

Wherein, each coefficient of a0 to a3 is assigned from index numbers shown in following Table 1. In addition, FIG. 8 represents a characteristic of different functions FN(x) according to each index number.

TABLE 1

| Coefficient | Index number | | | |
|---|---|---|---|---|
| | 1 | 2 | 3 | 4 |
| A0 | −0.0094 | 0.0 | 0.0140 | −0.0048 |
| A1 | 0.4129 | 0.1 | 0.8654 | 1.4620 |
| A2 | 2.4606 | 0.0 | 1.4423 | 0.3884 |
| A3 | −1.8632 | 0.0 | −1.3112 | −0.8557 |

At this time, in the control section (not shown) controlling the function block 27 and updating the reference value of each reference value register or internal register values determining the response characteristic of each AGC control section, if a status continuously occurs, in which the control voltage ("V3_I terminal signal) outputted from the AGC control section 20 is less than the control voltage ("V1_I terminal signal) outputted from the AGC control section 23, and at the same time, the control voltage ("V1_I terminal signal) outputted from the AGC control section 23 or the RSSI signal calculated from the AGC response control section 26 is less than the reference value "Ref6", the number of such statuses is counted. In addition, if the number of such statuses per a predetermined time exceeds a predetermined number, the index number determining the coefficient of the above function FN(x) is decreased.

Meanwhile, if a status continuously occurs, in which the control voltage ("V3_I terminal signal) outputted from the AGC control section 20 is less than the control voltage ("V1_I terminal signal) outputted from the AGC control section 23, and at the same time, the control voltage ("V1_I terminal signal) outputted from the AGC control section 23 or the RSSI signal calculated from the AGC response control section 26 is greater than the reference value "Ref6", the number of such statuses is counted. In addition, if the number of such statuses per a predetermined time exceeds a predetermined number, a coefficient "a" of the above function FN(x) is increased.

Accordingly, when the input level is low, the gain of the AGC amplifier installed at the front ends of the I-side channel filter 10 and the Q-side channel filter 11 is set to a higher level, thereby improving the SNR. In addition, if the input level is high, the gain of the AGC amplifier installed at the front ends of the I-side channel filter 10 and the Q-side channel filter 11 is set to a lower level, thereby compensating for the distortion generated from the AGC amplifier. In addition, in an area in which the distortion or the SNR causes a problem, the gain characteristic of the AGC amplifier installed at the front ends of the I-side channel filter 10 and the Q-side channel filter 11 becomes smooth so that the response characteristic of the AGC amplifier becomes slow and the re-modulation distortion of the AGC loop is reduced.

J. Calculation of RSSI

When the gain control for the AGC amplifier 4 is carried out by means of the control voltage outputted from the AGC control section 25, the level of the in-band object signal of a channel filter can be detected based on the control voltage outputted from the AGC control section 23 or the AGC control section 25.

In addition, when the gain control for the AGC amplifier 4 is carried out by means of the control voltage outputted from the AGC control section 20, the gain of the AGC amplifier 4 is decreased in accordance with a level of a non-object out-of-band signal of the channel filter. Therefore, in order to set the level of the object signal to a predetermined level, the AGC control section 23 may increase the gains of the I-side AGC amplifier 12 and the Q-side AGC amplifier 13.

For this reason, the level of the in-band objective signal of the channel filter band cannot be detected by means of the control voltage outputted from the AGC control section 23 or the AGC control section 25. In this case, the level of the in-band signal of the objective band can be obtained by compensating for an amount of gain variation of the AGC amplifier 4 based on the control voltage outputted from the AGC control section 23 or the AGC control section 25 and the control voltage outputted from the AGC control section 20.

In detail, in the AGC response control section 26, if control signals created from the AGC control sections 20 and 25 are control voltages V3 and V1, and at the same time, if an overall gain characteristic with respect to the control voltage V1 is G(V1) and a gain characteristic of front circuits of the I-side channel filter 10 and the Q-side channel filter 11 with respect to the control voltage V1 is G3(V1), the control voltage V1 becomes the strength of an in-band signal of the channel filter when the control voltage V3 is greater than the control voltage V1. In addition, when the control voltage V3 is less than the control voltage V1, a calculating value V is obtained as the strength of the in-band signal of the channel filter and is outputted from the RSSI terminal according to Equation 6:

$$V = V1 + (G3(V1)/G(V1))(V1 - V3) \qquad \text{Equation 6}$$

As described above, the automatic gain controller according to the first embodiment of the present invention includes the AGC amplifier 4 installed at front ends of the I-side channel filter 10 and the Q-side channel filter 11. In addition, the I-side AGC amplifier 12, the Q-side AGC amplifier 13, the I-side AGC amplifier 15 and the Q-side AGC amplifier 16 are installed at rear ends of the I-side channel filter 10 and the Q-side channel filter 11.

In addition, the AGC detector 9 detects the output signal of the AGC amplifier 4 at the front ends of the I-side channel filter 10 and the Q-side channel filter 11, and at the same time, the AGC detector 14 detects the output signals of the I-side AGC amplifier 12 and the Q-side AGC amplifier 13 and the AGC detector 15 detects the output signals of the I-side AGC amplifier 15 and the Q-side AGC amplifier 16 at the rear ends of the I-side channel filter 10 and the Q-side channel filter 11.

If out-of-band signals of the I-side channel filter 10 and the Q-side channel filter 11 are strong, the gain control for the AGC amplifier 4 is carried out based on the control signal of the AGC control section 20 by using the signal detected by the AGC detector 9. In addition, if out-of-band signals of the I-side channel filter 10 and the Q-side channel filter 11 are weak, the gain control for the AGC amplifier 4 is carried out based on the control signal of the AGC control section 25 by using the signal detected by the AGC detector 17.

In addition, output signals of the I-side AGC amplifier 12 and the Q-side AGC amplifier 13 controlled by the AGC control section 23 having a rapid response speed are utilized as output signals of the automatic gain controller. If level variation of the output signal of the AGC amplifier 4 is stable, the control signal of the AGC control section 23 is identical to the control signal of the AGC control section 25.

Accordingly, the automatic gain controller according to the first embodiment of the present invention can properly carry out the automatic gain control in accordance with the variation of the out-of-band signals of the channel filter extracting the object signal, effectively utilize a limited dynamic range, and prevent signal saturation at the front end of the channel filter. In addition, if the signal variation is very small at the front end of the channel filter, the response speed of the AGC amplifier installed at the rear end of the channel filter becomes slow, so that the object signal is prevented from distortion caused by the rapid AGC response.

Embodiment 2

Hereinafter, an automatic gain controller according to a second embodiment of the present invention will be described.

A. Structure

Figure 9:
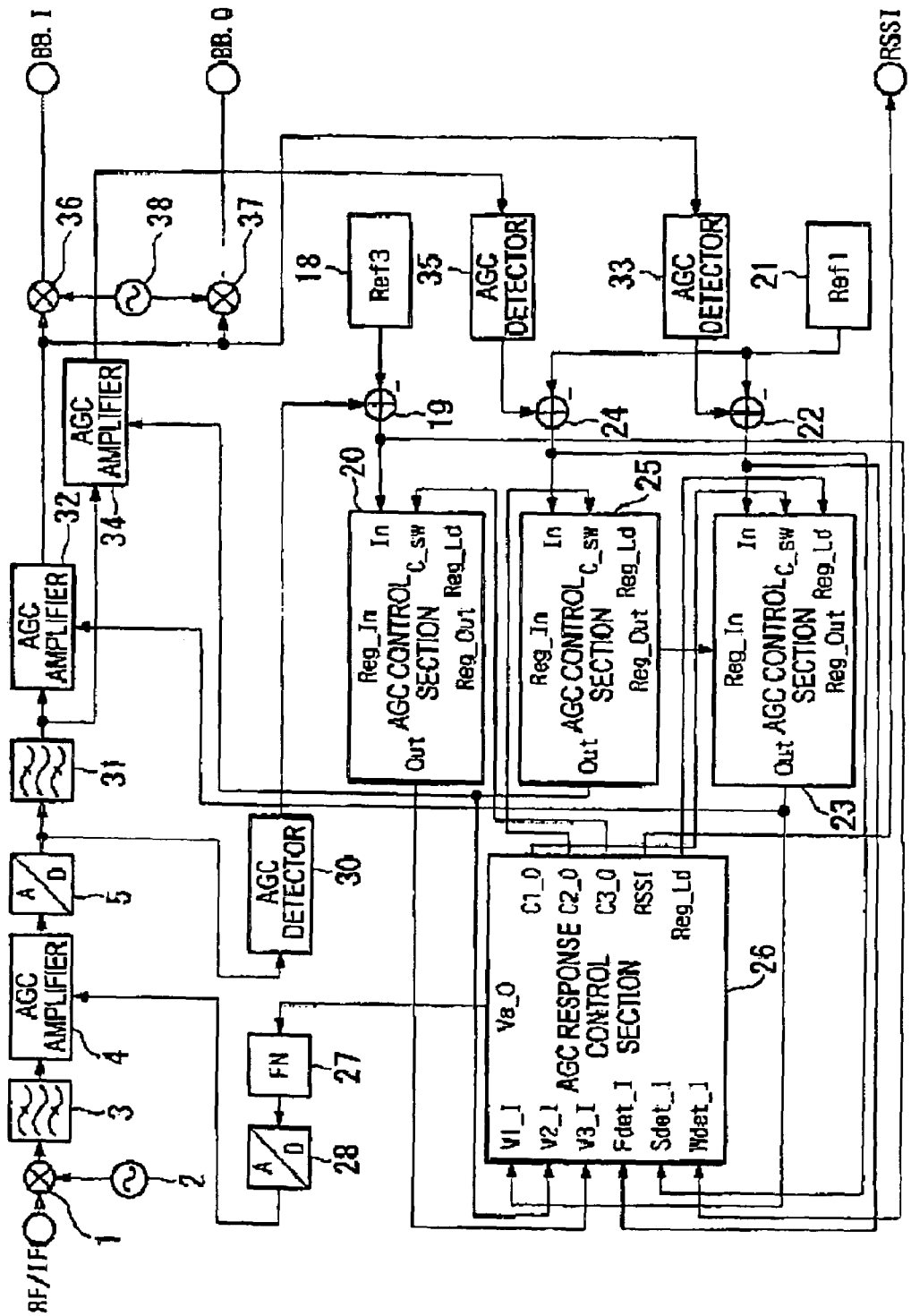
FIG. 9 is a block diagram showing a structure of a wireless apparatus having an AGC according to a second embodiment of the present invention.

FIG. 9 is a block diagram showing a structure of a wireless apparatus having an automatic gain controller according to the second embodiment of the present invention. The automatic gain controller according to the second embodiment is different from the automatic gain controller according to the first embodiment in that the automatic gain controller according to the first embodiment performs an orthogonal detection for a signal received in the front end of the channel filter extracting the object signal, and the automatic gain controller according to the second embodiment performs the orthogonal detection for a signal received in the channel filter and for a signal received rearward of the AGC amplifier installed at the rear end of the channel filter, and the AGC detection is carried out with an absolute value of a real signal.

Therefore, the second embodiment will be described with regard to different parts between the automatic gain controller of the first embodiment and the automatic gain controller of the second embodiment. In FIG. 9, the parts having the same reference numerals as the parts of FIG. 1 have the same functions and structures as those of the parts shown in FIG. 1, so they will not be further described below.

In addition, according to the automatic gain controller of the present invention, if an IF frequency of a received signal is lower than a half of a sampling frequency of the A/D converter 5, sample points per one period of a signal are densely formed, so a level detection error caused by a differential phase condition between the signal and the sample points will be reduced.

In detail, as shown in FIG. 9, the signal inputted into the mixer 1 from the RF/IF terminal is converted into a signal having a low frequency (input IF frequency of the A/D converter 5) in the mixer 1 by using a local signal having a first frequency, which is outputted from a local oscillator 2. Then, a signal having a predetermined frequency band is extracted from the signal outputted from the mixer 1 by using a bandpass filter 3.

An AGC amplifier 4 is a variable gain amplifier for converting an output signal of the bandpass filter 3 into a signal having a constant level. The signal having the predetermined frequency band, which is converted into the signal having the constant level by the AGC amplifier 4, is inputted into the A/D converter 5 so that the signal is converted into a quantizing digital signal by means of the A/D converter 5.

The quantizing digital signal having an IF frequency is inputted into an AGC detector 30, converted into a band signal of an objective band due to the band of the quantizing digital signal being limited by a channel filter 31, and is inputted into an AGC amplifier 32. In order to create a gain control signal for the AGC amplifier 4, the AGC detector 30 calculates an absolute value of the inputted IF frequency signal and integrates the absolute value, thereby detecting variation of an output signal of the A/D converter 5.

In addition, the AGC amplifier 32 is a variable gain amplifier for converting an output signal of the channel filter 31 into a signal having a constant level. The band signal of the objective band, which is converted into the signal having the constant level by the AGC amplifier 32, is subject to an orthogonal detection. The orthogonal detection is carried out by using a local signal (cosine wave in I-side and −sine wave in Q-side) having a second frequency outputted from a digital local oscillator 38 of an I-side mixer 36 and a Q-side mixer 37 and is converted into a complex number signal having a baseband frequency represented by an I-axis signal and a Q-axis signal. In addition, the signal is outputted from the wireless apparatus as complex number signals BB.I and BB.Q having baseband frequencies.

In addition, the band signal of the objective band, which is converted into the signal having the constant level by the AGC amplifier 32, is inputted into an AGC detector 33. In order to create a gain control signal for the AGC amplifier 32, the AGC detector 33 calculates an absolute value of the inputted band signal of the objective band and integrates the absolute value, thereby detecting variation of an output signal of the AGC amplifier 32.

In the same manner, the signal converted into the band signal of the objective band and band-limited by the channel filter 31 is inputted into an AGC amplifier 34. The AGC amplifier 34 is a variable gain amplifier for converting an output signal of the channel filter 31 into a signal having a constant level. The band signal of the objective band, which is converted into the signal having the constant level by the AGC amplifier 34, is inputted into an AGC detector 35.

In order to create a gain control signal for the AGC amplifier 34, the AGC detector 35 calculates an absolute value of the inputted band signal of the objective band and integrates the absolute value, thereby detecting variation of an output signal of the AGC amplifier 34.

The AGC detectors 30, 33 and 35 will be described in detail later.

Meanwhile, in order to create signals for controlling the gain of each AGC amplifier, output signals of the AGC detectors 30, 33 and 35 are inputted into an AGC control section creating a gain control signal for each AGC amplifier. In detail, a reference value Ref3 outputted from a reference value register 18 is subtracted from an output signal of the AGC detector 30 by means of a subtractor 19 and a result thereof is inputted into an "In terminal" of an AGC control section 20.

In addition, a reference value Ref1 outputted from a reference value register 21 is subtracted from an output signal of the AGC detector 33 by means of a subtractor 22 and a result thereof is inputted into an "In terminal" of an AGC control section 23. Also, the reference value Ref1 outputted from the reference value register 21 is subtracted from an output signal of the AGC detector 35 by means of a subtractor 24 and a result thereof is inputted into an "In terminal" of an AGC control section 25 having response characteristic lower than response characteristic of the AGC control section 23.

Other connection structures of the automatic gain controller according to the second embodiment of the present invention are similar to those of the automatic gain controller according to the first embodiment of the present invention, so they will not be further described below.

B. AGC Detector

Hereinafter, AGC detectors 30, 33 and 35 of the automatic gain controller according to the second embodiment will be described in detail with reference to accompanying drawings. The AGC detectors 30, 33 and 35 have the same structure with each other, and FIG. 10 shows a structure of a real input type AGC detector.

Figure 10:
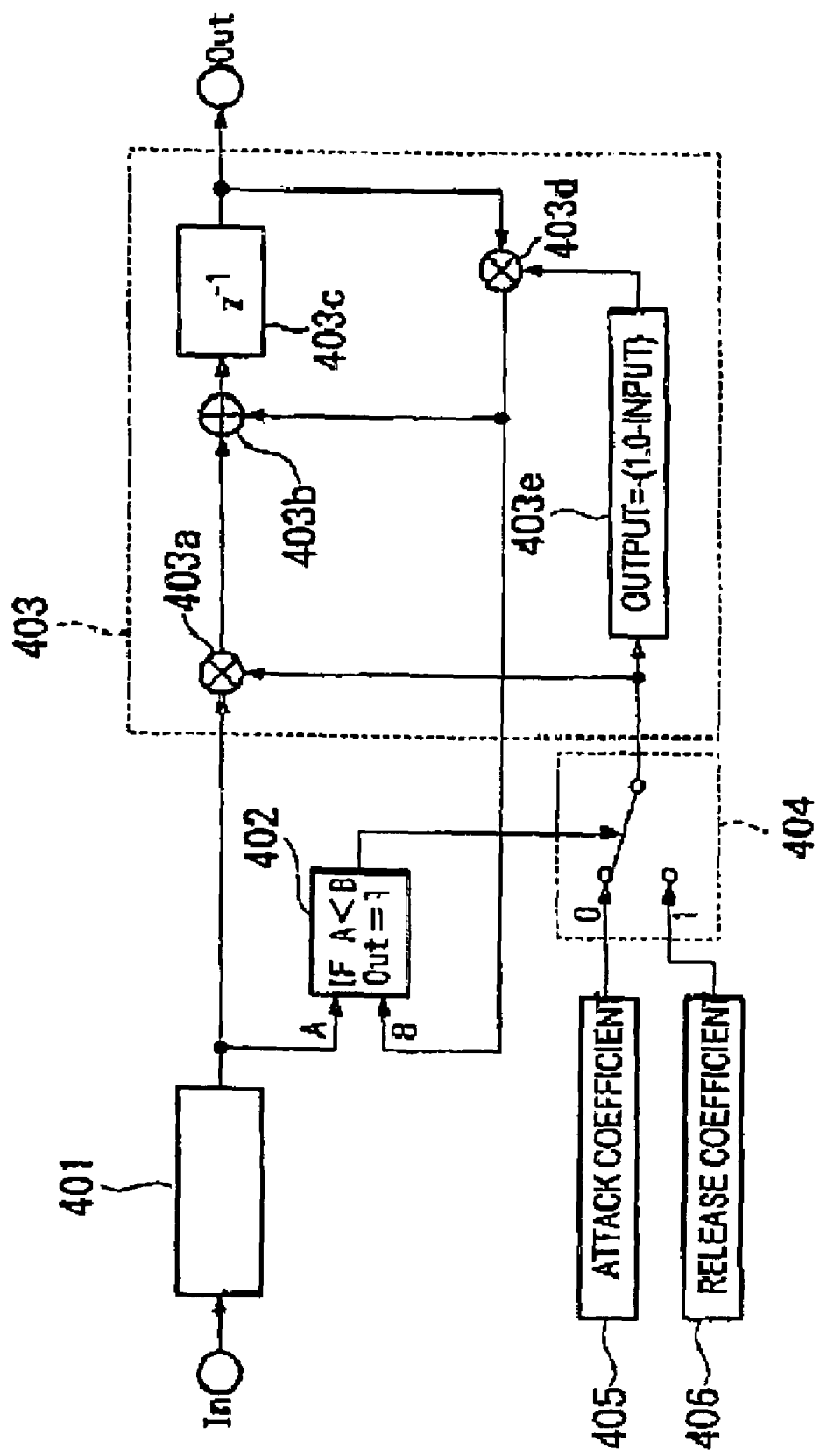
FIG. 10 is a block diagram showing a structure of an AGC detector (real input) of an automatic gain controller according to the second embodiment of the present invention.

Referring to FIG. 10, as a signal is inputted through an "In terminal", an absolute value calculator 401 calculates an absolute value of the signal. An output signal of the absolute value calculator 401 is simultaneously inputted into a comparator 402 and an integrator 403 including a multiplier 403*a*, an adder 403*b*, a delay unit 403*c*, a multiplier 403*d*, and a coefficient calculator 403*e*.

Herein, the integrator 403 is designed to integrate the output signal of the absolute value calculator 401 based on any one of an attack coefficient outputted from an attack coefficient register 406 and a release coefficient outputted from a release coefficient register 405 (wherein, an attack coefficient value is larger than a release coefficient value), which are selected by a switch 404 controlled by means of an output signal of the comparator 402. In detail, the output signal of the absolute value calculator 401 inputted into the integrator 403 is multiplied by one of the attack coefficient and the release coefficient, which are inputted into the integrator 403 as numerator coefficients, by means of the multiplier 403*a*.

In addition, a denominator coefficient of the attack coefficient or the release coefficient inputted into the integrator 403 is calculated by means of the coefficient calculator 403*e*. An output signal of the coefficient calculator 403*e* is multiplied by an output signal of the integrator 403 through the multiplier 403*d* and the result thereof is added to an output signal of the multiplier 403*a* by means of the adder 403*b*. Meanwhile, an output signal of the adder 403*b* is outputted through an "Out terminal" via the delay unit 403*c* as an output signal of the integrator 403, that is, as an output signal of the AGC detector.

The comparator 402 compares the output signal of the absolute value calculator 401 with an output signal of the multiplier 403*d*. If the output signal of the absolute value calculator 401 is smaller than the output signal of the multiplier 403*d*, the switch 404 selects the release coefficient so as to enlarge an integration time constant. If the output signal of the absolute value calculator 401 is larger than the output signal of the multiplier 403*d*, the switch 404 selects the attack coefficient so as to reduce the integration time constant. Thus, the output signal level of the integrator 403 may be between an effective value and a peak value of an input signal. In addition, the attack coefficient value is larger than the release coefficient value. As a differential value between the attack coefficient value and the release coefficient value becomes large, the output signal of the integrator 403 may be close to the peak value.

In addition, an orthogonal detector extracts an envelope of a received signal by using an analog mixer.

The AGC detector 30 rectifies a signal by using a diode and can detect a level of the received signal.

As described above, the automatic gain controller according to the second embodiment performs the orthogonal detection for a signal received in the channel filter and for a signal received rearward of the AGC amplifier installed at the rear end of the channel filter. Therefore, the envelope of the signal can be obtained by calculating the absolute value of the signal using the AGC detector. In addition, the automatic gain controller can properly carry out the automatic gain control in accordance with variations of the out-of-band signals of the channel filter extracting the object signal, and can effectively utilize a limited dynamic range. In order to restrict the level variation in the AGC detector 30, it is necessary to enlarge a ratio of the sampling frequency to a signal frequency.

Figure 11:
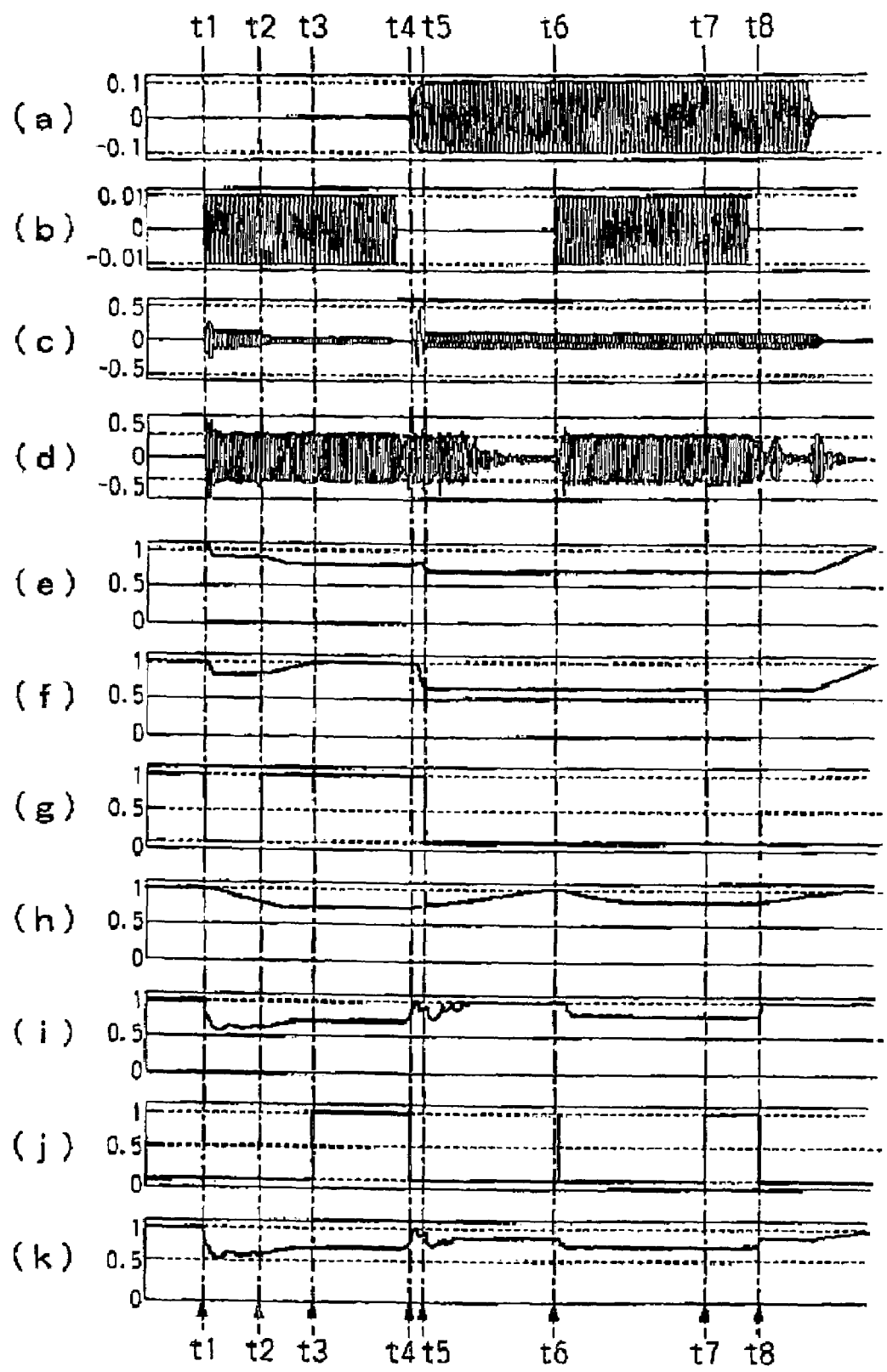
FIGS. 11A to 11K are views showing a response waveform in each part of an automatic gain controller according to the second embodiment of the present invention.

FIGS. 11A to 11K are views showing a response waveform in each part of the automatic gain controller according to the second embodiment of the present invention. FIG. 11A represents an out-of-band signal of channel filter 31, FIG. 11B represents an in-band signal of channel filter 31, FIG. 11C represents an output signal of A/D converter 5, FIG. 11D represents an output signal of an automatic gain controller, FIG. 11E represents a "Va_O terminal" output signal of AGC response control section 26, FIG. 11F represents an "Out terminal" output signal of AGC control section 20, FIG. 11G represents a "Csa terminal" output signal of AGC response control section 26 (wherein, a "Csa terminal" of AGC response control section 26 is an output terminal of comparator 301 connected to switch 302 and OR circuit 310 shown in FIG. 4), FIG. 11H represents an "Out terminal" output signal of AGC control section 25, FIG. 11I represents an "Out terminal" output signal of AGC control section 23, FIG. 11J represents a "Reg_Ld terminal" output signal of AGC response control section 26, and FIG. 11K represents a "RSSI terminal" output signal of AGC response control section 26.

Referring to FIGS. 11A to 11K, when an in-band signal of the channel filter 31 is inputted at a first time t1, since the response characteristic of the AGC control section 25 is slower than the response characteristic of the AGC control section 20, the "Out terminal" output signal of the AGC control section 20 is outputted through a "Va_O terminal" of the AGC response control section 26 by means of the "Csa terminal" output signal of the AGC response control section 26. At this time, since the out-of-band signal of the channel filter 31 has not been inputted, the "Out terminal" output signal of the AGC control section 25 is directly outputted through the "Va_O terminal" of the AGC response control section 26 at a second time t2, in which the AGC control section 25 reacts with the response of the AGC control section 20.

Meanwhile, when the output signal of the A/D converter 5 has been stabilized, control information of the AGC control section 25 is copied in the AGC control section 23 at a third time t3 by means of a "C1_O terminal" output signal of the AGC response control section 26. Thus, the "Out terminal" output signal of the AGC control section 25 represents the response characteristic identical to the response characteristic of the "Out terminal" output signal of the AGC control section 23. In addition, at a fourth time t4, the AGC control section 23 operates separately from the AGC control section 25 in order to rapidly increase the gain of the AGC amplifier 32 to match with the stop of the in-band signal of the channel filter 31.

In addition, at a fifth time t5, the "Out terminal" output signal of the AGC control section 20 is outputted through the "Va_O terminal" of the AGC response control section 26 by means of the "Csa terminal" output signal of the AGC response control section 26 to match with an input of the out-of-band signal of the channel filter 31. At this time, the output signal of the automatic gain controller includes "ringing" from the channel filter 31 caused by the out-of-band signal of the channel filter 31 even though the in-band signal of the channel filter 31 is in a stop state. This is because weak signals of a channel band must have a predetermined level, the AGC amplifier 32 achieves a high gain due to a high-speed response, and the ringing from the channel filter 31 becomes a visible amplitude level.

Then, at a sixth time t6, since the out-of-band signal of the channel filter 31, which has a level stronger than a level of the in-band signal, has been already inputted, the "Csa terminal" output signal of the AGC response control section 26 does not vary even if the in-band signal of the channel filter 31 is inputted. At this time, the output signal of the automatic gain controller includes the in-band signal of the channel filter 31. Although the out-of-band signal of the channel filter 31 has been already inputted, if the output signal of the A/D converter 5 is stabilized, control information of the AGC control section 25 can be copied in the AGC control section at a seventh time t7 by means of the "Reg_Ld terminal" output signal of the AGC response control section 26. Thus, the "Out terminal" output signal of the AGC control section 25 represents the response characteristic identical to the response characteristic of the "Out terminal" output signal of the AGC control section 23.

In addition, at an eighth time t8, the AGC control section 23 operates separately from the AGC control section 25 in order to rapidly increase the gain of the AGC amplifier 32 to match with the stop of the in-band signal of the channel filter 31. At this time, the output signal of the automatic gain controller includes "ringing" from the channel filter 31 caused by the out-of-band signal of the channel filter 31 even though the in-band signal of the channel filter 31 is in a stop state. This is because weak signals of a channel band must have a predetermined level, the AGC amplifier 32 achieves a high gain due to a high-speed response, and the ringing from the channel filter 31 becomes a visible amplitude level.

Embodiment 3

Hereinafter, an automatic gain controller according to a third embodiment of the present invention will be described.

A. Structure

Figure 12:
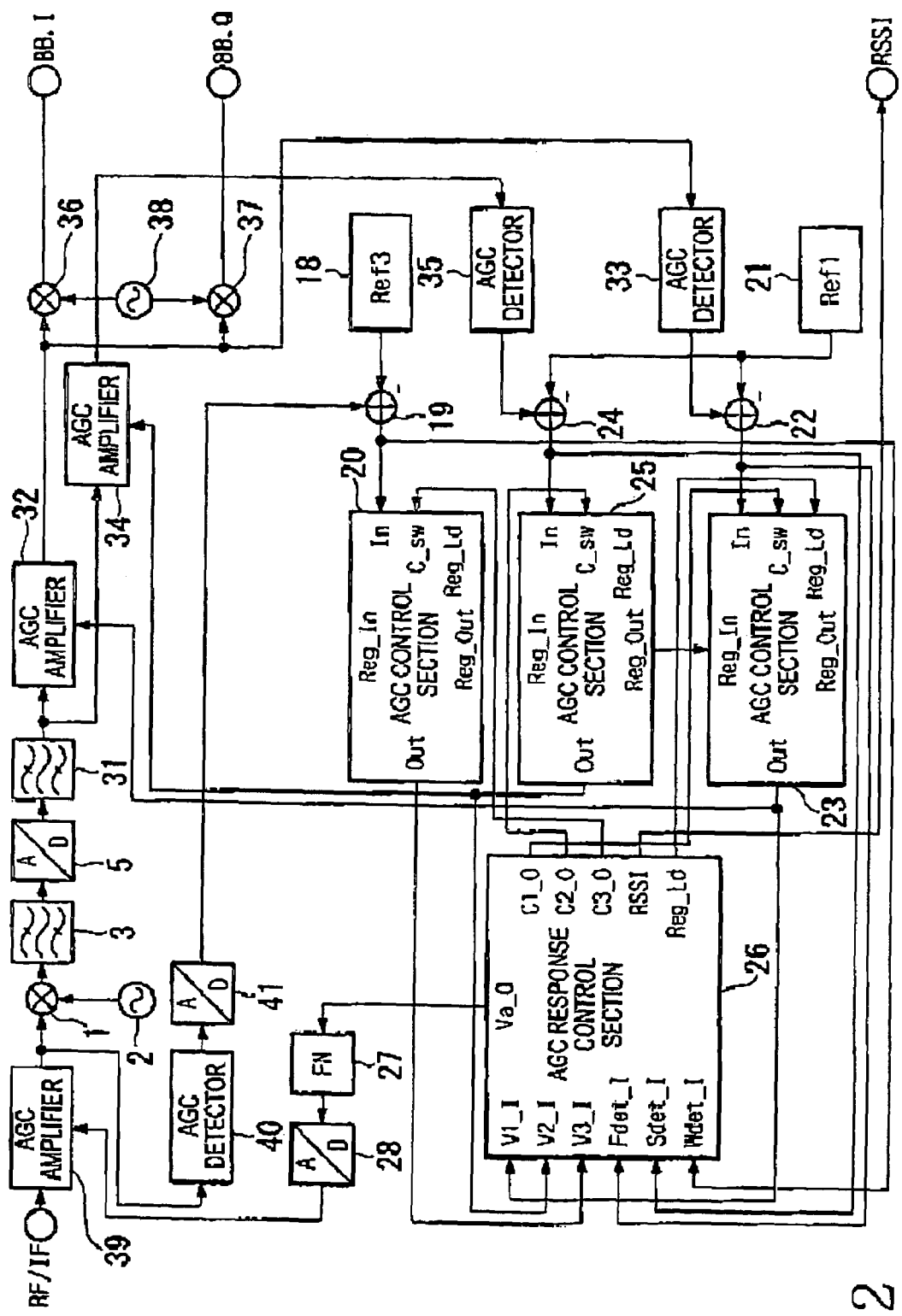
FIG. 12 is a block diagram showing a structure of a wireless apparatus having an AGC according to a third embodiment of the present invention.

FIG. 12 is a block diagram showing a structure of a wireless apparatus having the automatic gain controller according to the third embodiment of the present invention. The automatic gain controller according to the third embodiment is different from the automatic gain controller according to the second embodiment in that the automatic gain controller according to the second embodiment performs the gain control for the AGC amplifier, which is installed at the front end of the channel filter extracting the object signal, in an IF frequency band rearward of the mixer, and the automatic gain controller according to the third embodiment performs the gain control in an RF/IF frequency band forward of the mixer.

Therefore, the third embodiment will be described with regard to different parts between the automatic gain controller of the second embodiment and the automatic gain controller of the third embodiment. In FIG. 12, the parts having the same reference numerals as the parts of FIG. 9 have the same functions and structures as those of the parts shown in FIG. 9, so they will not be further described below.

In detail, as shown in FIG. 12, a signal inputted from an RF/IF terminal is inputted into an AGC amplifier 39. A gain control for the AGC amplifier 39 is carried out by means of an output signal of a D/A converter 28. The AGC amplifier 39 is a variable gain amplifier for setting a level of an input signal inputted into a mixer 1 to a predetermined level. The input signal, which is converted into the signal having the predetermined level by the AGC amplifier 39, is inputted into the mixer 1. Then, the input signal is converted into a signal having a low frequency (input IF frequency of the A/D converter 5 installed at a rear end) in the mixer 1 by using a local signal having a first frequency, which is outputted from a local oscillator 2. Then, a signal having a predetermined frequency band is extracted from the signal outputted from the mixer 1 by using a bandpass filter 3.

For instance, the AGC amplifier 39 can be realized by varying an attenuation degree of a pin diode by restricting voltage applied to the pin diode.

Meanwhile, the input signal, which is converted into the signal having a predetermined level by the AGC amplifier 39, is inputted into an AGC detector 40. In order to create a gain control signal for the AGC amplifier 39, the AGC detector 40 detects variation of an output signal of the AGC amplifier 39 by rectifying the output signal of the AGC amplifier 39 through a diode. Since the AGC detector 40 creates the gain control signal for the AGC amplifier 39, the output signal of the AGC detector 40 is quantized and converted into a digital signal through an A/D converter 41. Then, a reference value Ref3 outputted from a reference value register 18 is subtracted from the output signal of the AGC detector 40 by means of a subtractor 19 and a result thereof is inputted into an "In terminal" of the AGC control section 20.

Other connection structures of the automatic gain controller according to the third embodiment of the present invention are similar to those of the automatic gain controller according to the second embodiment of the present invention, so they will not be further described below.

As described above, the automatic gain controller according to the third embodiment of the present invention performs the gain control at the front end of the channel filter extracting the object signal in the RF frequency band. Therefore, as the same as the automatic gain controller according to the first embodiment of the present invention, the automatic gain controller according to the third embodiment of the present invention can properly perform the automatic gain control to match with variations of the out-of-band signal of the channel filter extracting the object signal. In addition, the automatic gain controller according to the third embodiment of the present invention can effectively utilize a limited dynamic range and can prevent signal saturation at the front end of the channel filter while restricting signal distortion in the RF frequency band. In a case of a receiver, in which the IF frequency is not converted into a digital signal, the signal distortion can be reduced at the front end of the channel filter.

Embodiment 4

Hereinafter, an automatic gain controller according to a fourth embodiment of the present invention will be described.

A. Structure

Figure 13:
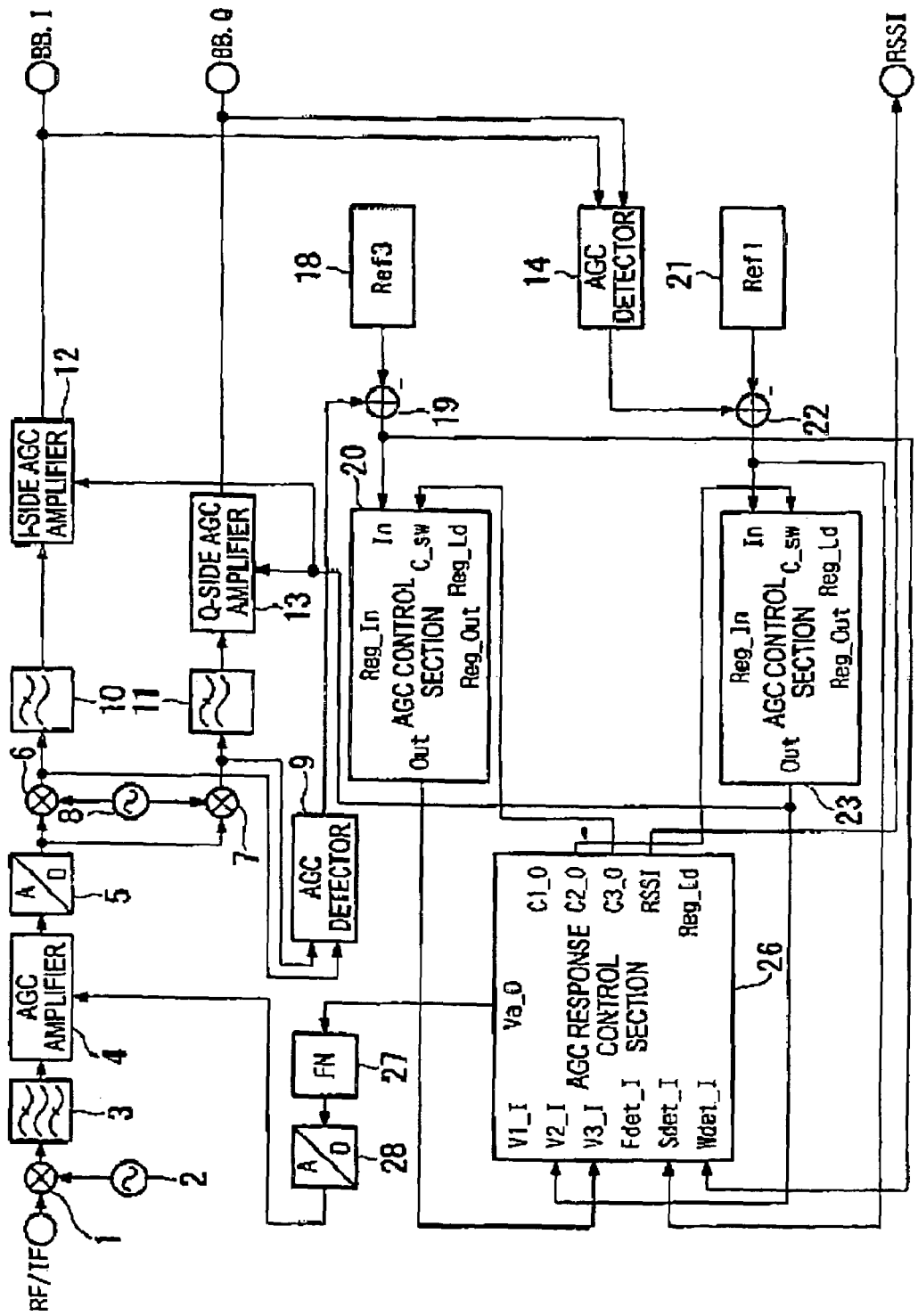
FIG. 13 is a block diagram showing a structure of a wireless apparatus having an AGC according to a fourth embodiment of the present invention.

FIG. 13 is a block diagram showing a structure of a wireless apparatus having an AGC according to the fourth embodiment of the present invention. The automatic gain controller according to the fourth embodiment is different from the automatic gain controller according to the first embodiment in that the automatic gain controller according to the first embodiment includes the first AGC loop and the second AGC loop at rear ends of the I-side channel filter 10 and the Q-side channel filter 11, and an output signal of the automatic gain controller is extracted from the first AGC loop, in which the first AGC loop has the I-side AGC amplifier 12, the Q-side AGC amplifier 13, the AGC detector 14 and the AGC control section 23 and performs a high-speed response. The second AGC loop of the first embodiment has the I-side AGC amplifier 15, the Q-side AGC amplifier 16, the AGC detector 17 and the AGC control section 25 and performs a low-speed response with a low signal distortion. However, the automatic gain controller according to the fourth embodiment does not have a second AGC loop including the I-side AGC amplifier 15, the Q-side AGC amplifier 16, the AGC detector 17 and the AGC control section 25.

In detail, according to the automatic gain controller of the fourth embodiment, the I-side AGC amplifier 15, the Q-side AGC amplifier 16, the AGC detector 17 and the AGC control section 25 shown in FIG. 1 are omitted. In addition, the output signal of the AGC control section 23 is not inputted into the "V1_I terminal", but inputted into the "V2-I terminal" of the AGC response control section 26. Furthermore, the time constant of response characteristic of the AGC control section in the automatic gain controller of the fourth embodiment is identical to the time constant of the response characteristic of the AGC control section 25 in the automatic gain controller of the first embodiment.

As described above, the automatic gain controller according to the fourth embodiment of the present invention omits the second AGC loop including the I-side AGC amplifier 15, the Q-side AGC amplifier 16, the AGC detector 17 and the AGC control section 25, which are provided in the automatic gain controller according to the first embodiment of the present invention. Therefore, as the same as the automatic gain controller according to the first embodiment of the present invention, the automatic gain controller according to the fourth embodiment of the present invention can properly perform the automatic gain control to match with variations of the out-of-band signal of the channel filter extracting the object signal, while minimizing signal processing at the rear end of the channel filter. In addition, the automatic gain controller according to the fourth embodiment of the present invention can effectively utilize a limited dynamic range and can prevent signal saturation at the front end of the channel filter.

Embodiment 5

Figure 14:
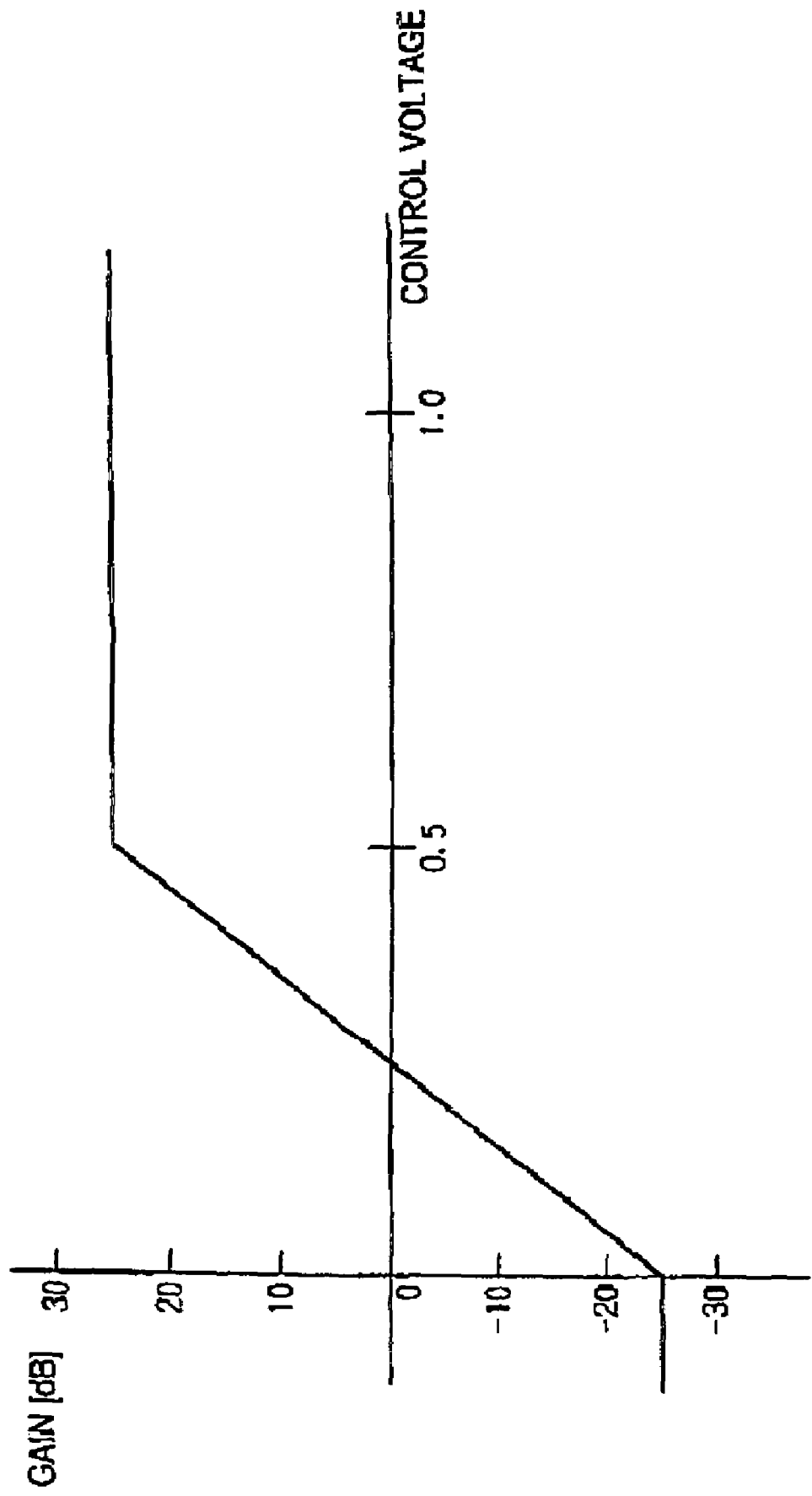
FIG. 14 is a graph showing an example of a gain characteristic of an AGC amplifier as a function of control voltage when the AGC amplifier is installed at a rear end of a channel filter of an automatic gain controller according to a fifth embodiment of the present invention.

Hereinafter, the characteristic of the automatic gain controllers according to the first to fourth embodiments of the present invention will be described with reference to FIGS. 14 and 15. FIG. 14 is a graph showing an example of a gain characteristic of an AGC amplifier as a function of control voltage when the AGC amplifier is installed at the rear end of the channel filter. According to the characteristic of the AGC amplifier shown in FIG. 14, the gain is constantly maintained at −25 [dB] when the control voltage is below 0.0, and is constantly maintained at 25 [dB] when the control voltage is above 0.5. In addition, when the control voltage is in a range between 0.0 and 0.5, the gain increases by 10 [dB] as the control voltage increases by 0.1 and the gain becomes 0 [dB] when the control voltage is 0.25.

Figure 15:
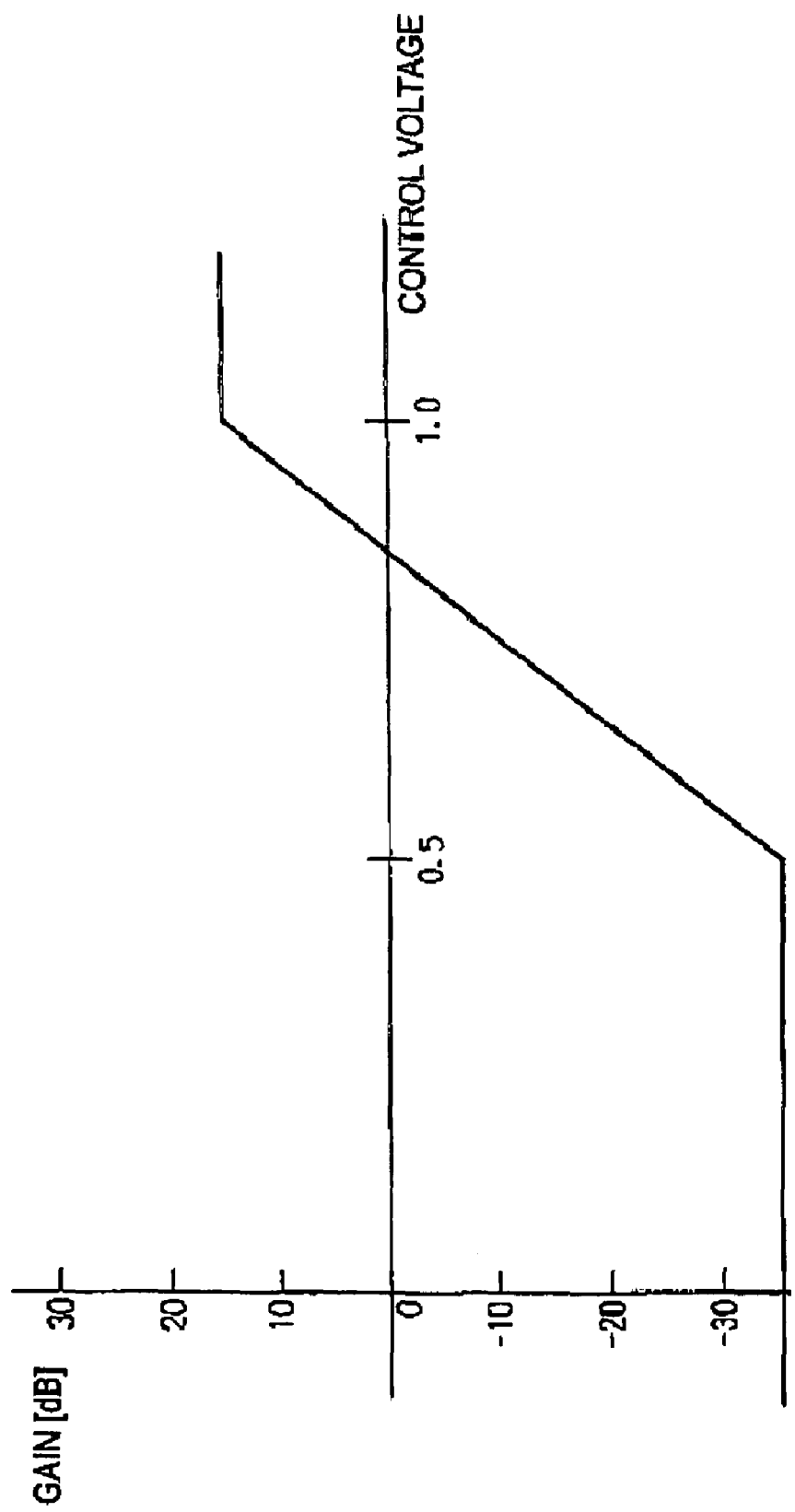
FIG. 15 is a graph showing an example of a gain characteristic of an AGC amplifier as a function of control voltage when the AGC amplifier is installed at a front end of a channel filter of an automatic gain controller according to the fifth embodiment of the present invention.

FIG. 15 is a graph showing an example of a gain characteristic of the AGC amplifier as a function of control voltage when the AGC amplifier is installed at the front end of the channel filter. According to the characteristic of the AGC amplifier shown in FIG. 15, the gain is constantly maintained at −35 [dB] when the control voltage is below 0.5, and is constantly maintained at 15 [dB] when the control voltage is above 1.0. In addition, when the control voltage is in a range between 0.5 and 1.0, the gain increases by 10 [dB] as the control voltage increases by 0.1 and the gain becomes 0 [dB] when the control voltage is 0.85.

If the gain characteristic of the AGC amplifiers according to first to the fourth embodiments of the present invention is formed identical to the gain characteristic shown in FIGS. 14 and 15, it is possible to prevent the SNR from deterioration caused by an inferior NF (noise figure) by maintaining the gain of the AGC amplifier, which is installed at the front end of the channel extracting the object signal, at a high level when a small amount of signals is inputted. However, if the gain of the AGC amplifier, which is installed at the front end of the channel extracting the object signal, is maintained at the high level, signal saturation may occur due to the out-of-band signals of the channel filter.

Accordingly, when the AGC amplifiers having the above-mentioned response characteristic are provided in the automatic gain controllers according to the first to fourth embodiments of the present invention, it is necessary to adjust the gain of the AGC amplifier installed at the front end of the channel filter in such a manner that signal saturation does not occur when a small amount of signals is inputted. At this time, the control voltage of the AGC control section for each AGC amplifier is above 0.5.

In addition, when a large amount of signals is inputted, the gain of the AGC amplifier installed at the front end of the channel filter must be minimized and gain control is carried out by means of the AGC amplifier installed at the rear end of the channel filter in order to raise the signal level, which has been dropped by means of the AGC amplifier installed at the front end of the channel filter. At this time, the control voltage of the AGC control section for each AGC amplifier is below 0.5.

In the automatic gain controller according to the fifth embodiment of the present invention, a non-sensitive area against the control voltage of the AGC control section is formed at a front portion or a rear portion of the channel filter extracting the object signal. For this reason, the response characteristic of the automatic gain controller according to the fifth embodiment of the present invention may be lowered than the automatic gain controllers according to the first to fourth embodiments of the present invention. However, the automatic gain controller according to the fifth embodiment of the present invention can maintain a superior NF while preventing signal saturation at the front portion of the channel filter.

Embodiment 6

In the automatic gain controllers according to the first to fourth embodiments of the present invention, the attack coefficient and the release coefficient, which are multiplied by the input signals from the AGC control sections 23 and 25, are set to "0" (attack coefficient=release coefficient=0). When quality information of a received signal can be obtained from a signal demodulation section connected to the rear end of the automatic gain controller, it is necessary to prevent signal receiving performance from deterioration caused by the signal distortion and inferior SNR (signal to noise ratio). In addition, it is necessary to update the reference value "Ref1" outputted from the reference value register 21 and subtracted from the output signal of the AGC detector 14 or AGC detector 17 by means of the subtractor 22 or subtractor 24 based on obtained quality information and to perform a level distribution control with respect to each AGC amplifier.

In automatic gain controllers for controlling the gain of the AGC amplifier based on communication quality, the automatic gain controller according a sixth embodiment of the present invention can prevent signal saturation from being created at the front end of the channel filter caused by the out-of-band signals of the channel filter extracting the object signal.

As described above, the automatic gain controller according to the present invention includes a first variable gain amplifying unit installed at the front end of the channel filter extracting the object signal, and second and third variable gain amplifying units installed at the rear end of the channel filter. In addition, a control signal selecting unit is provided to select a control signal from control signals generated by first and second control signal generating units in order to control the first variable gain amplifying unit, in such a manner that the first variable gain amplifying unit installed at the front end of the filter can be controlled based on variation of the signal inputted into the channel filter or variation of the signal outputted from the filter. Accordingly, out-of-band signals of the filter doe not exert an influence when a gain control is performed for the in-band signal of the filter.

Therefore, the automatic gain controller of the present invention can properly carry out the automatic gain control in accordance with variations of the out-of-band signals of the channel filter extracting the object signal and can effectively utilize a limited dynamic range while preventing signal saturation at the front end of the filter.

In addition, the second and third variable gain amplifying units are installed at both sides of the rear end of the filter, and the third variable gain amplifying unit outputs the signal as an output signal of the automatic gain controller. At the same time, when the first variable gain amplifying unit installed at the front end of the channel filter is controlled based on variations of the signal outputted from the channel filter by using the second control signal generating unit, control information of the second control signal generating unit is copied in the third control signal generating unit. The gain control for the third variable gain amplifying unit is carried out in accordance with a response speed of the second control signal generating unit. Thus, the automatic gain controller may output the signal without occurring signal distortion.

Accordingly, when the variation of the signal at the front end of the channel filter is very small, the response speed of the AGC amplifier installed at the rear end of the channel filter becomes slow, so that the object signal is prevented from being distorted due to a rapid AGS response.

In addition, when quality information of a received signal is obtained from a signal demodulation section connected to a rear end of the automatic gain controller, and when the first control signal generating unit generates the control signal based on a level of an input signal, a reference value, which is compared with the level of the input signal and is varied depending on a status of quality information by means of a reference value varying unit, so that it is possible to balance the influence of the out-of-band signal and the in-band signal of the filter when gain control is carried out with respect to the in-band signal of the filter.

Furthermore, the automatic gain controller of the present invention has a gain distribution adjusting unit. The gain distribution adjusting unit adjusts the gain distribution in a front end circuit and a rear end circuit of the filter by comparing levels of the out-of-band signal and the in-band signal of the filter with each other, thereby properly distributing the gain in front and rear portions of the filter.

Accordingly, the automatic gain controller of the present invention can effectively utilize a limited dynamic range and can prevent the SNR from deterioration caused by an inferior NF (noise figure) while preventing signal saturation at the front end of the channel filter. Thus, an optical signal may be outputted from the automatic gain controller.

In addition, the automatic gain controller of the present invention has a signal strength calculating unit so as to measure a level of the object signal based on the control signal generated from each control signal generating unit. Thus, the automatic gain controller can easily measure the level of the object signal based on the control signal generated from each control signal generating unit.

Therefore, the automatic gain controller of the present invention can output the optimum signal having an optimum level regardless of the statuses of the out-of-band signal and the in-band signal of the filter.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An automatic gain controller comprising:
   a first variable gain amplifying means for amplifying an input signal;
   a filter for limiting a band of an output signal of the first variable gain amplifying means;
   a second variable gain amplifying means for outputting an output signal of the filter to an exterior by amplifying the output signal of the filter;
   a first control signal generating means generating a first control signal for controlling a level of the output signal of the first variable gain amplifying means to a predetermined level;
   a second control signal generating means generating a second control signal for controlling a level of an output signal of the second variable gain amplifying means to a predetermined level and outputting the second control signal to the second variable gain amplifying means; and
   a control signal selecting means selecting one of the first and second control signals generated from the first and second control signal generating means and outputting a selected control signal to the first variable gain amplifying means.

2. The automatic gain controller as claimed in claim 1, wherein the control signal selecting means compares the first control signal of the first control signal generating means with the second control signal of the second control signal generating means, and at the same time, selects one of the first and second control signals capable of lowering a gain of the first variable gain amplifying means, and outputs the selected signal to the first variable gain amplifying means.

3. The automatic gain controller as claimed in claim 2, further comprising a reference value varying means for varying a reference value, which is compared with a level of an input signal, depending on a status of quality information, when quality information of a received signal is obtained from a signal demodulation section connected to a rear end of the automatic gain controller and when the first control signal generating means generates the first control signal based on a level of the input signal.

4. The automatic gain controller as claimed in claim 3, wherein the reference value varying means varies the reference value by comparing a level of the first control signal generated from the first control signal generating means with a level of the second control signal generated from the second control signal generating means, and by comparing a level of a received in-band signal with a predetermined value.

5. The automatic gain controller as claimed in claim 4, further comprising a gain distribution adjusting means for adjusting a gain distribution in a front end circuit and a rear end circuit of the filter by comparing a level of an out-of-band signal of the filter with a level of an in-band signal of the filter.

6. The automatic gain controller as claimed in claim 5, further comprising a signal strength calculating means, wherein, if the first control signal generated from the first control signal generating means is control voltage $V3$, and the second control signal generated from the second control signal generating means is control voltage $V1$, and at the same time, if an overall gain characteristic with respect to the control voltage $V1$ is $G(V1)$ and a gain characteristic of the front end circuit of the filter with respect to the control voltage $V1$ is $G3(V1)$, the signal strength calculating means determines the control voltage $V1$ as a strength of an in-band signal of the filter when the control voltage $V3$ is greater than the control voltage $V1$, and determines a calculating value $V$ as the strength of the in-band signal of the filter when the control voltage $V3$ is less than the control voltage $V1$, wherein the calculating value $V$ satisfies:

$$V=V1+(G3(V1)/G(V1))(V1-V3).$$

7. An automatic gain controller comprising:
   a first variable gain amplifying means for amplifying an input signal;
   a filter for limiting a band of an output signal of the first variable gain amplifying means;
   a second variable gain amplifying means for amplifying an output signal of the filter;
   a third variable gain amplifying means for outputting the output signal of the filter by amplifying the output signal of the filter;
   a first control signal generating means generating a first control signal for controlling a level of the output signal of the first variable gain amplifying means to a predetermined level;
   a second control signal generating means generating a second control signal for controlling a level of an output signal of the second variable gain amplifying means to a predetermined level and outputting the second control signal to the second variable gain amplifying means;
   a third control signal generating means having a response characteristic faster than a response characteristic of the second control signal generating means, generating a third control signal for controlling a level of an output signal of the third variable gain amplifying means to a predetermined level, and outputting the third control signal to the third variable gain amplifying means; and
   a control signal selecting means selecting one of the first and second control signals generated from the first and second control signal generating means and outputting a selected control signal to the first variable gain amplifying means.

8. The automatic gain controller as claimed in claim 7, wherein each of the second and third control signal generating means includes a control information copying unit for copying control information of the second control signal generating means into the third control signal generating means, and the control information copying unit copies control information of the second control signal generating means into the third control signal generating means when the control signal selecting means selects the second control signal generated from the second signal generating means and outputs the second control signal to the first variable gain amplifying means.

9. The automatic gain controller as claimed in claim 8, wherein the control signal selecting means allows the control information copying unit to copy control information of the second control signal generating means into the third control signal generating means, when a variation value of the first control signal generated from the first control signal generating means per a unit time is less than a predetermined value.

10. The automatic gain controller as claimed in claim 9, wherein the control signal selecting means compares the first control signal of the first control signal generating means with the second control signal of the second control signal generating means, and at the same time, selects one of the first and second control signals capable of lowering a gain of the first variable gain amplifying means, and outputs the selected signal to the first variable gain amplifying means.

11. The automatic gain controller as claimed in claim 10, further comprising a reference value varying means for varying a reference value, which is compared with a level of an input signal, depending on a status of quality information, when quality information of a received signal is obtained from a signal demodulation section connected to a rear end of the automatic gain controller and when the first control signal generating means generates the first control signal based on a level of the input signal.

12. The automatic gain controller as claimed in claim 11, wherein the reference value varying means varies the reference value by comparing a level of the first control signal generated from the first control signal generating means with a level of the second control signal generated from the second control signal generating means, and by comparing a level of a received in-band signal with a predetermined value.

13. The automatic gain controller as claimed in claim 12, further comprising a gain distribution adjusting means for adjusting a gain distribution in a front end circuit and a rear end circuit of the filter by comparing a level of an out-of-band signal of the filter with a level of an in-band signal of the filter.

14. The automatic gain controller as claimed in claim 13, further comprising a signal strength calculating means, wherein, if the first control signal generated from the first control signal generating means is control voltage $V3$, and the second control signal generated from the second control signal generating means is control voltage $V1$, and at the same time, if an overall gain characteristic with respect to the control voltage $V1$ is $G(V1)$ and a gain characteristic of the front end circuit of the filter with respect to the control voltage $V1$ is $G3(V1)$, the signal strength calculating means determines the control voltage $V1$ as a strength of an in-band signal of the filter when the control voltage $V3$ is greater than the control voltage $V1$, and determines a calculating value V as the strength of the in-band signal of the filter when the control voltage $V3$ is less than the control voltage $V1$, wherein the calculating value V satisfies:

$$V=V1+(G3(V1)/G(V1))(V1-V3).$$

* * * * *